United States Patent
Lai et al.

(10) Patent No.: US 10,811,602 B2
(45) Date of Patent: Oct. 20, 2020

(54) TUNGSTEN OXIDE RRAM WITH BARRIER FREE STRUCTURE

(71) Applicant: MACRONIX INTERNATIONAL CO., LTD., Hsinchu (TW)

(72) Inventors: Erh-Kun Lai, Longling Shiang (TW); Dai-Ying Lee, Hukou Township (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 140 days.

(21) Appl. No.: 15/836,446

(22) Filed: Dec. 8, 2017

(65) Prior Publication Data
US 2019/0181339 A1 Jun. 13, 2019

(51) Int. Cl.
*H01L 45/00* (2006.01)
*G11C 13/00* (2006.01)
(Continued)

(52) U.S. Cl.
CPC ........ *H01L 45/1233* (2013.01); *G11C 13/003* (2013.01); *G11C 13/0007* (2013.01);
(Continued)

(58) Field of Classification Search
CPC ... H01L 45/1233; H01L 27/2436–2454; H01L 45/04; H01L 45/06; H01L 45/1633;
(Continued)

(56) References Cited

U.S. PATENT DOCUMENTS 7,667,220 B2 * 2/2010 Ho .................. H01L 45/1273
257/4
7,960,224 B2 6/2011 Chien et al.
(Continued)

FOREIGN PATENT DOCUMENTS

WO 2014148587 A1 9/2014

OTHER PUBLICATIONS

TW Office Action dated Aug. 23, 2017, and English translation of same, from family member Application No. 10720779010, 8 pages.
(Continued)

*Primary Examiner* — Yu Chen
(74) *Attorney, Agent, or Firm* — Haynes Beffel & Wolfeld LLP

(57) ABSTRACT

Memory devices based on tungsten oxide memory elements are described, along with methods for manufacturing such devices. A memory device includes a plug extending upwardly from a top surface of a substrate through a dielectric layer; a bottom electrode having tungsten on an outside surface, the bottom electrode extending upwardly from a top surface of the plug; an insulating material in contact with the tungsten on the outside surface of, and surrounding, the bottom electrode; a memory element on an upper surface of the bottom electrode, the memory element comprising a tungsten oxide compound and programmable to at least two resistance states; and a top electrode overlying and contacting the memory element. The plug has a first lateral dimension, and the bottom electrode has a lateral dimension parallel with the first lateral dimension of the plug that is less than the first lateral dimension.

19 Claims, 24 Drawing Sheets

(51) Int. Cl.
*H01L 21/768* (2006.01)
*H01L 27/24* (2006.01)

(52) U.S. Cl.
CPC .. *H01L 21/76843* (2013.01); *H01L 21/76865* (2013.01); *H01L 21/76883* (2013.01); *H01L 21/76888* (2013.01); *H01L 27/2436* (2013.01); *H01L 45/08* (2013.01); *H01L 45/1253* (2013.01); *H01L 45/1633* (2013.01); *H01L 45/1683* (2013.01); *H01L 45/1691* (2013.01); *G11C 2213/32* (2013.01); *G11C 2213/52* (2013.01); *G11C 2213/79* (2013.01); *G11C 2213/82* (2013.01)

(58) Field of Classification Search
CPC ............... H01L 45/146; H01L 45/1675; H01L 27/2463; H01L 21/76831; H01L 45/1683; H01L 45/1691; H01L 45/1253–1273; H01L 45/08; H01L 21/76865; H01L 21/76883; H01L 21/76888; H01L 45/085; H01L 45/1246; H01L 45/1273; H01L 45/1666; H01L 21/76802–76817; H01L 21/76843–76849; H01L 21/76892–76894; G11C 13/0007; G11C 13/003; G11C 2213/32; G11C 2213/52; G11C 2213/79; G11C 2213/11
See application file for complete search history.

(56) References Cited

U.S. PATENT DOCUMENTS

| | | | |
|---|---|---|---|
| 8,860,111 | B2 | 10/2014 | Lung et al. |
| 8,941,089 | B2 | 1/2015 | Gopalan et al. |
| 8,962,466 | B2 | 2/2015 | Lee et al. |
| 9,172,036 | B2 | 10/2015 | Chen et al. |
| 9,425,391 | B1 | 8/2016 | Lai et al. |
| 9,455,402 | B2 | 9/2016 | Lin et al. |
| 9,455,403 | B1 * | 9/2016 | Lai ...................... H01L 45/1233 |
| 9,514,815 | B1 | 12/2016 | Lin et al. |
| 9,583,700 | B2 | 2/2017 | Lee et al. |
| 9,680,095 | B2 | 6/2017 | Chen et al. |
| 10,157,693 | B2 * | 12/2018 | Liu ........................ A61N 5/10 |
| 10,157,963 | B1 * | 12/2018 | Lee ...................... H01L 27/2436 |
| 2007/0155172 | A1 * | 7/2007 | Lai ...................... H01L 27/2436 438/666 |
| 2008/0138931 | A1 * | 6/2008 | Lung ..................... H01L 45/04 438/102 |
| 2008/0304312 | A1 | 12/2008 | Ho et al. |
| 2009/0101883 | A1 | 4/2009 | Lai et al. |
| 2009/0184310 | A1 * | 7/2009 | Lung ..................... H01L 45/06 257/4 |
| 2010/0301480 | A1 * | 12/2010 | Choi ..................... H01L 45/06 257/751 |
| 2011/0012079 | A1 * | 1/2011 | Chen ..................... H01L 45/04 257/2 |
| 2011/0215371 | A1 * | 9/2011 | Tang .................... H01L 27/1027 257/133 |
| 2013/0214234 | A1 * | 8/2013 | Gopalan ............... H01L 45/085 257/3 |
| 2014/0264232 | A1 | 9/2014 | Lee et al. |
| 2015/0179510 | A1 | 6/2015 | Thompson et al. |
| 2016/0218284 | A1 * | 7/2016 | Lin ...................... H01L 45/1253 |
| 2016/0225983 | A1 * | 8/2016 | Lin ...................... H01L 45/146 |
| 2016/0260898 | A1 | 9/2016 | Lai et al. |
| 2017/0206960 | A1 * | 7/2017 | Wu .................... G11C 13/0069 |

OTHER PUBLICATIONS

Cooper et al., "Selective High-Throughput Tin Etching Methods," Solid State Phenomena, vol. 195, Dec. 2013, pp. 143-145.

* cited by examiner

TUNGSTEN OXIDE RRAM WITH BARRIER FREE STRUCTURE

BACKGROUND

Field

The present invention relates to memory devices and methods for manufacturing high density memory devices, and more particularly to memory devices having a data storage material like tungsten oxide compounds.

Description of Related Art

Nonvolatile memory devices include magnetic random access memory MRAM, ferroelectric random access memory FRAM and phase-change random access memory PCRAM and other resistive random access memory RRAM. RRAM has attracted much attention because of its simple structure and small cell size.

Metal-oxide based RRAM can be caused to change resistance between two or more stable ranges by application of electrical pulses at levels suitable for implementation in integrated circuits, and the resistance can be read and written with random access to indicate stored data.

In a RRAM memory cell, a memory element (e.g. a tungsten oxide compound) is formed on an electrode (e.g. tungsten). A smaller dimension electrode is preferred, because a smaller dimension electrode can provide lower operation voltage, lower operation power, and higher reliability. A TiN or TaN barrier layer is formed between a smaller dimension electrode and an interlayer dielectric. The material in the TiN or TaN barrier layer may contaminate a memory element formed on the electrode, and cause fast degradation of cycling endurance of a memory device such as a tungsten oxide RRAM.

Thus, it is desirable to provide a memory cell structure having a memory element on a smaller dimension electrode, and not contaminated by the material in the TiN or TaN barrier layer.

SUMMARY

Memory devices based on tungsten oxide memory elements are described, along with methods for manufacturing such devices.

A memory device described herein includes a plug extending upwardly from a top surface of a substrate through a dielectric layer. The memory device includes a bottom electrode having tungsten on an outside surface, the bottom electrode extending upwardly from a top surface of the plug. An insulating material is in contact with the tungsten on the outside surface of, and surrounding, the bottom electrode.

The memory device includes a memory element programmable to at least two resistance states contacting an upper surface of the bottom electrode, the memory element can comprise a tungsten oxide compound. The tungsten oxide compound can comprise a layer formed by oxidation of the upper surface of the bottom electrode. A tungsten oxide compound as used herein can include $WO_3$, $W_2O_5$, and $WO_2$. The memory element has no titanium or titanium compounds.

The memory device can include a barrier layer between the plug and the dielectric layer, the bottom electrode being physically separated from the barrier layer by the insulating material. The barrier layer has a different material than the bottom electrode. The barrier layer can comprise TiN or TaN between the dielectric layer and the plug.

In embodiments described herein, the plug has a first lateral dimension, and the bottom electrode has a lateral dimension parallel with the first lateral dimension of the plug that is less than the first lateral dimension. For instance, the bottom electrode can have a dimension between 5 nanometers and 50 nanometers. A memory element on the bottom electrode which has a lateral dimension less than the first lateral dimension of the plug can have lower operation voltage, lower operation power, and higher reliability than a memory element on a bottom electrode that has a lateral dimension not less than a lateral dimension of a plug.

The memory device includes a top electrode overlying and contacting the memory element, wherein the bottom electrode is surrounded on its sides by the insulating material between the top surface of the plug and a bottom surface of the top electrode. The memory device can include a bit line overlying and contacting the top electrode.

The memory device can have an access device on the substrate, where the access device can comprise a transistor having first and second doped regions, and the first doped region can be coupled to the plug.

The memory device can have a second plug extending upwardly from the top surface of the substrate through the dielectric layer to contact a source line. The second plug can be coupled to the second doped region of the transistor. A barrier layer can surround the second plug through the dielectric layer. The barrier layer has a different material than the second plug.

The memory device can further comprise bias circuitry adapted to apply a bias arrangement to the memory element for storing a data value, wherein the bias arrangement for storing the data value comprises a sequence of pulses adapted to set the resistance state of the memory element to a resistance corresponding to the data value.

A method for manufacturing a memory device as described herein includes forming a dielectric layer on a substrate, a sacrificial layer overlying the dielectric layer, a first via through the dielectric layer, and a plug in the first via.

An opening is formed through the sacrificial layer exposing the plug. In one embodiment, forming an opening in the sacrificial layer can include forming the first via through the sacrificial layer, and recessing the tungsten material in the first via to form the opening. The recessing step includes forming a top surface of the plug below a lower surface of the sacrificial layer. In an alternative embodiment, forming an opening in the sacrificial layer can include forming a mask over the sacrificial layer, the mask having an open etch region over the plug; and etching through the sacrificial layer to form the opening over the plug, using the mask, and to expose a top surface of the plug.

A bottom electrode is formed inside the opening having tungsten on an outside surface, and extending upwardly from a top surface of the plug. The plug has a first lateral dimension, and the bottom electrode has a lateral dimension parallel with the first lateral dimension of the plug that is less than the first lateral dimension.

The sacrificial layer is removed, and the bottom electrode is filled around over the plug with an insulating material.

A memory element is formed on an upper surface of the bottom electrode, the memory element comprising a tungsten oxide compound and programmable to at least two resistance states.

A spacer can be formed in the opening, the spacer defining a reduced dimension opening in the first via. The spacer can comprise the same material as the sacrificial layer. The spacer can comprise at least one of TiN and TaN. This allows formation of the tungsten material between the spacers without need of additional deposition steps to line the spacers with an adhesion/barrier material.

Forming the spacer can include forming a mask overlying the sacrificial layer, the mask having an open etch region over the first via; depositing a spacer layer in the first via and on the mask; etching the spacer layer until the mask is exposed; and depositing an adhesion layer in the first via, the adhesion layer being thinner than the spacer layer. For instance, the adhesion layer can have a thickness between 0.5 nanometers and 5 nanometers. The spacer layer and the adhesion layer can comprise the same material as the sacrificial layer, so they can be removed at a same process step later.

The reduced dimension opening in the first via through the sacrificial layer is filled with the tungsten material, to form the bottom electrode on the top surface of the plug. The spacer in the first via is removed at a same process step as removing the sacrificial layer. An upper surface of the bottom electrode is oxidized to form the memory element.

A top electrode can be formed overlying and contacting the memory element in the first via, and a bit line can be formed overlying and contacting the top electrode.

In one embodiment, a barrier layer can be formed lining some or all of the first via, wherein the memory element is physically separated from the barrier layer by the insulating material. The barrier layer can comprise the same material as the sacrificial layer, and the step to remove the sacrificial layer can use an etch process that removes a portion of the barrier layer in the first via.

A second via can be formed through the dielectric layer, and a second plug can be formed in the second via. An access device can be formed on the substrate, the access device comprising a transistor having first and second doped regions coupled to the tungsten material in the first via and the tungsten material in the second via respectively.

Other aspects and advantages of the present invention can be seen on review of the drawings, the detailed description and the claims, which follow.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
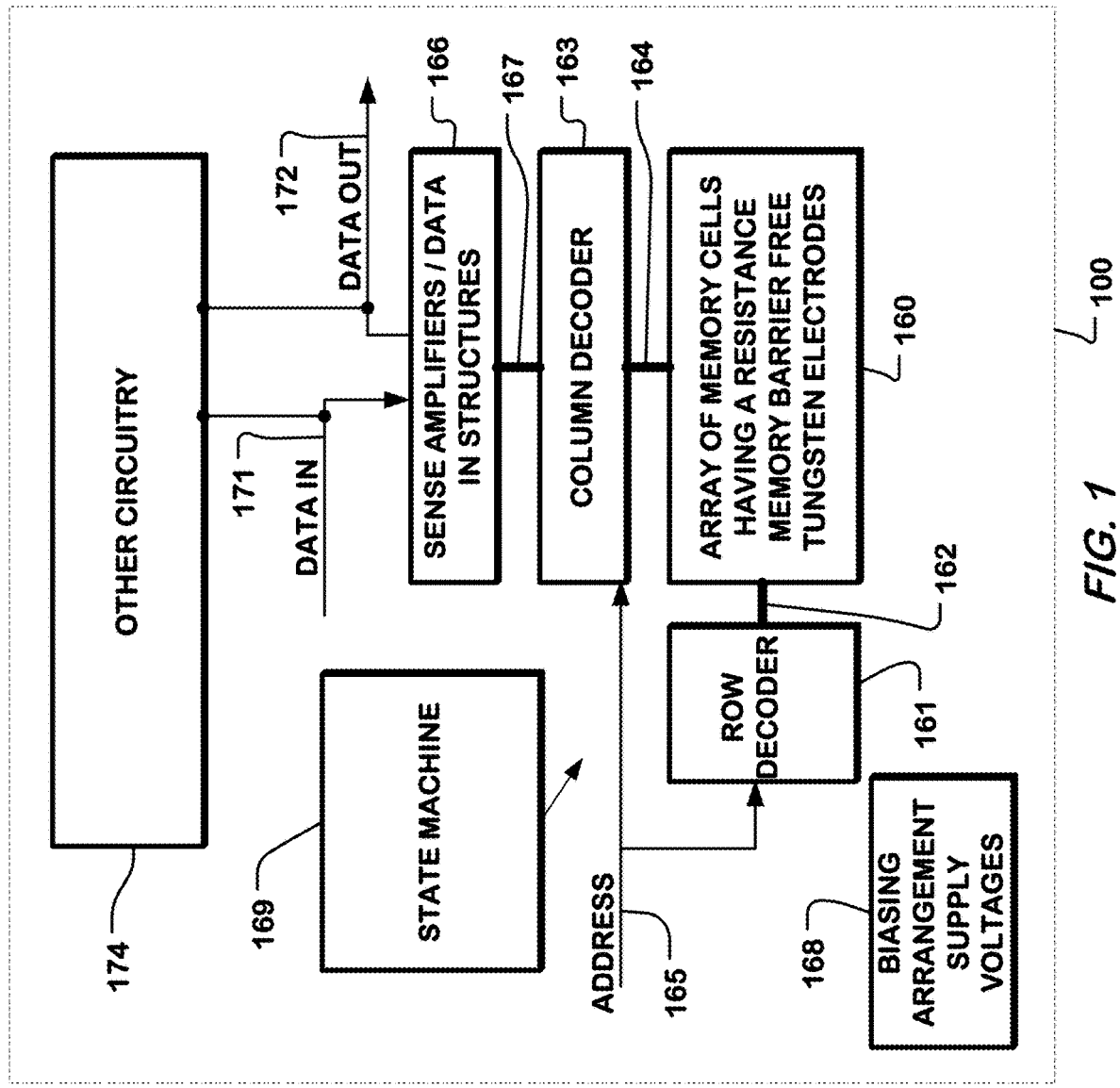
FIG. 1 is a simplified block diagram of an integrated circuit including a memory cell array implemented using embedded resistance memory based on one or more tungsten compounds.

FIG. 1 is a simplified block diagram of an integrated circuit 100 including a memory cell array 160 implemented using resistance memory having barrier free tungsten electrode and memory material based on for example, one or more tungsten oxide compounds. A row decoder 161 having one or more of each of read, set and reset modes is coupled to a plurality of word lines 162 arranged along rows in the memory array 160. A column decoder 163 is coupled to a plurality of bit lines 164 arranged along columns in the memory array 160 for reading, setting and resetting data to the memory cells in the memory array 160. Addresses are supplied on a bus 165 to a column decoder 163 and a row decoder 161. Sense amplifiers and data-in structures in a block 166, including current sources for the read, set and reset modes, are coupled to the column decoder 163 via a data bus 167. Data is supplied via the data-in line 171 from input/output ports on the integrated circuit 100 or from other data sources internal or external to the integrated circuit 100, to the data-in structures in the block 166. In the illustrated embodiment, other circuitry 174 is included on the integrated circuit 100, such as a general purpose processor or special purpose application circuitry, or a combination of modules providing system-on-a-chip functionality supported by the memory cell array 160. Data is supplied via the data-out line 172 from the sense amplifiers in block 166 to input/output ports on the integrated circuit 100, or to other data destinations internal or external to the integrated circuit 100.

A controller utilized in this example using bias arrangement state machine 169 controls the application of bias arrangement supply voltages such as read, set, reset, and verify voltages, via bias circuitry 168. The bias circuitry 168 can be adapted to apply a bias arrangement to the memory element for storing a data value, wherein the bias arrangement for storing the data value comprises a sequence of pulses adapted to set the resistance state of the memory element to a resistance corresponding to the data value. The controller can be implemented using special purpose logic circuitry as known in the art. In alternative embodiments, the controller comprises a general purpose processor, which may be implemented on the same integrated circuit, which executes a computer program to control the operations of the device. In yet other embodiments, a combination of special purpose logic circuitry and a general purpose processor may be utilized for implementation of the controller.

Figure 2:
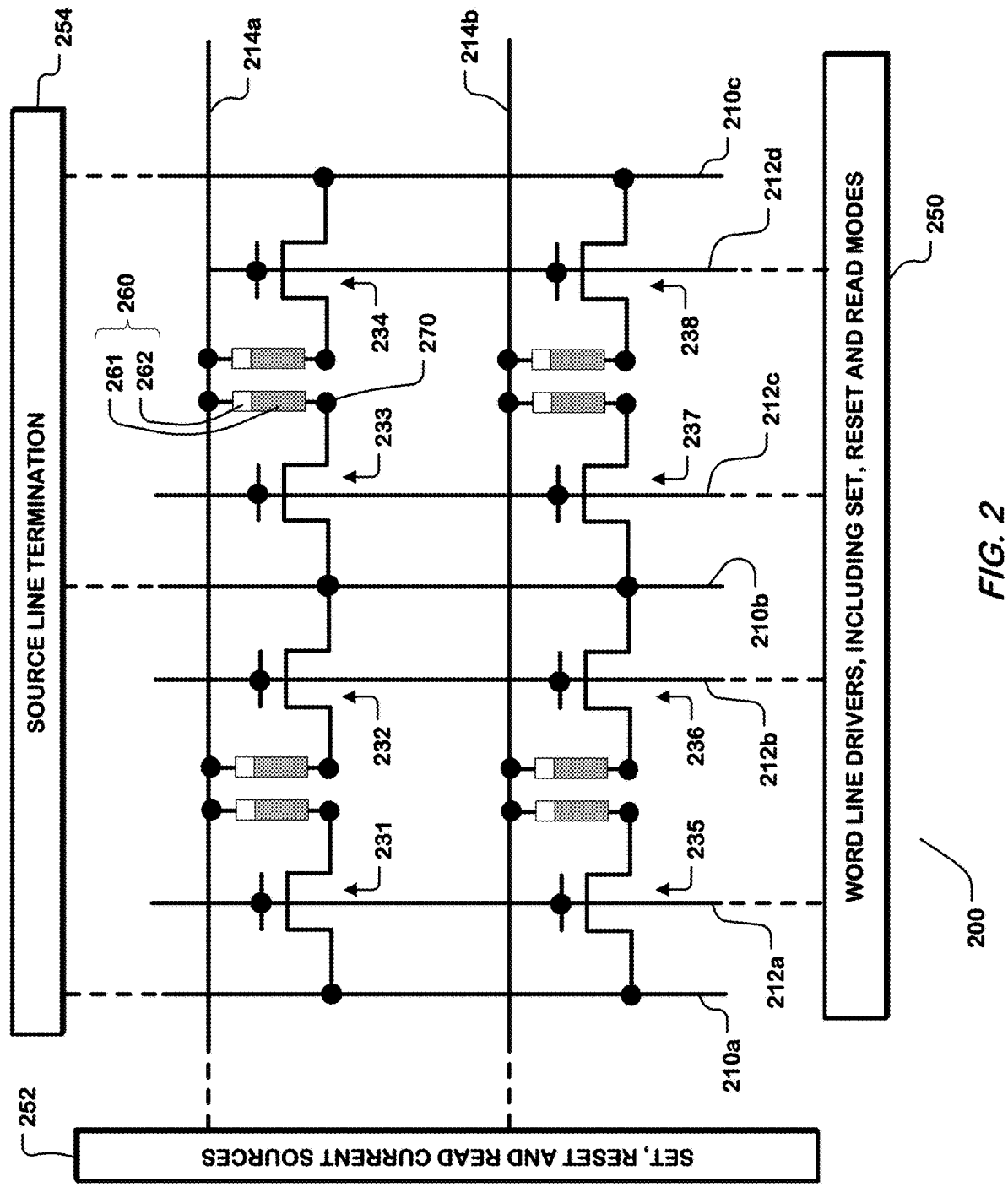
FIG. 2 is a schematic illustration of a memory array implemented using memory cells as described herein.

FIG. 2 is a schematic illustration of a memory array 200 implemented using memory cells as described herein. Eight memory cells 231, 232, 233, 234, 235, 236, 237, and 238 each having respective access transistors and memory elements, each of the memory elements including a bottom electrode and a memory element self-aligned to the bottom electrode, are illustrated in FIG. 2, representing a small section of an array that can include millions of memory cells. The bottom electrode can comprise tungsten. Alternative access devices are possible. For instance, the access transistors can be replaced by access diodes. In a cross point array for example, the access device is in series with the memory cell between the bit line and the word line, and there is no source line.

In the schematic illustration of FIG. 2, common source lines 210a, 210b and 210c, word lines 212a, 212b, 212c, and 212d are arranged generally parallel in the y-direction. Bit lines 214a and 214b are arranged generally parallel in the x-direction. Thus, a y-decoder and word line driver 250, having one or more set, reset, and read modes, are coupled to the word lines 212a, 212b, 212c, and 212d. Bit line current sources 252 for one or more set, reset, and read modes, a decoder and sense amplifiers (not shown) are coupled to the bit lines 214a and 214b. The common source lines 210a, 210b and 210c are coupled to the source line termination circuit 254, such as a ground terminal. The source line termination circuit 254 may include bias circuits such as voltage and current sources, and decoding circuits applying bias arrangements, other than ground, to the source lines in some embodiments.

The common source line 210a is coupled to the source terminals of access transistors in memory cells 231, 235. The common source line 210b is coupled to the source terminals of access transistors in memory cells 232, 233, 236, 237. The common source line 210c is coupled to the source terminals of access transistors in memory cells 234, 238. The word line 212a is coupled to the gate terminals of access transistors in memory cells 231, 235. The word line 212b is coupled to the gate terminals of access transistors in memory cells 232, 236. The word line 212c is coupled to the gate terminals of access transistors in memory cells 233, 237. The word line 212d is coupled to the gate terminals of access transistors in memory cells 234, 238.

Memory cell 233 including bottom electrode 261 and memory element 262 is representative. Bottom electrode 261 and memory element 262 couple the drain 270 of the access transistor of memory cell 233 to bit line 214a. The memory element 262 comprises one or more tungsten oxide compounds, and can be programmed to two or more stable resistance values to indicate data stored in the memory cell 233. In other embodiments, the access transistors can be replaced by access diodes, or other structures for controlling current flow to selected devices in the array for reading and writing data.

Figure 3:
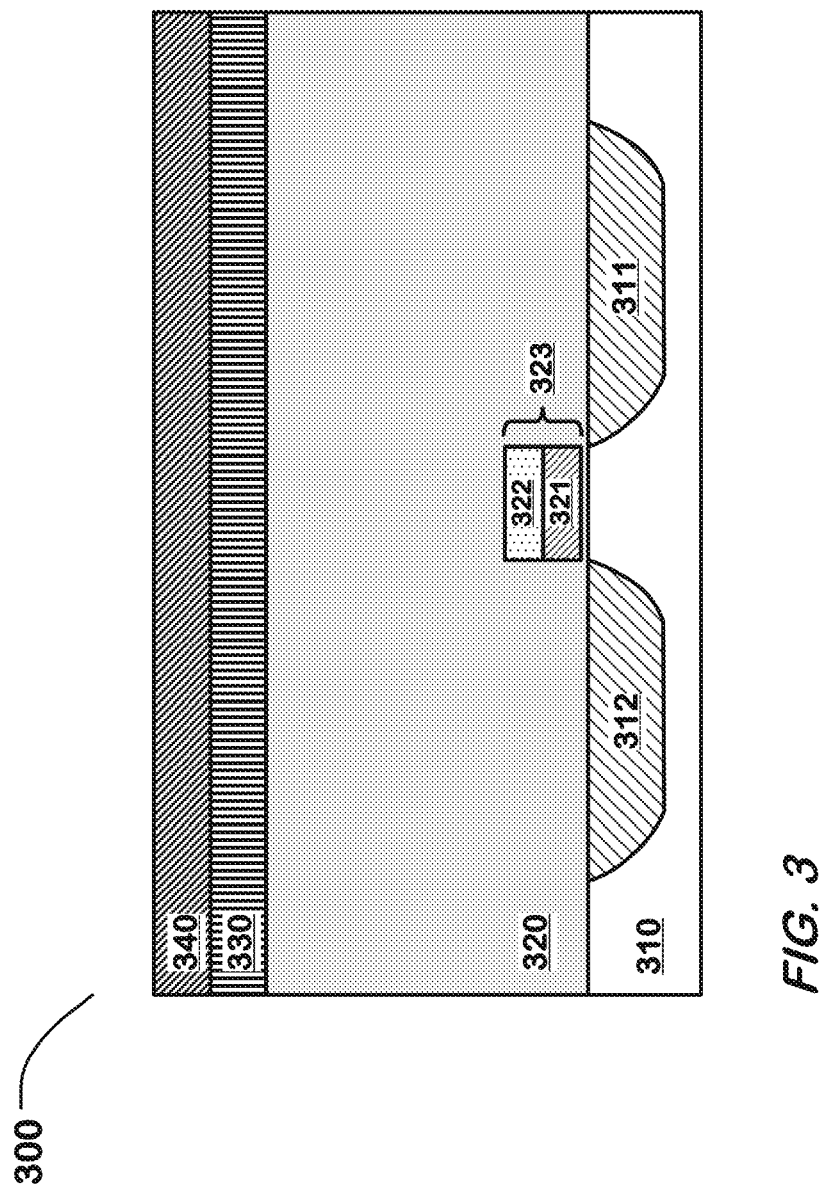
FIGS. 3-13 illustrate a method of manufacturing a memory cell including a memory element in accordance with a first embodiment, the memory element comprising a tungsten oxide compound and programmable to at least two resistance states.
Figure 4:
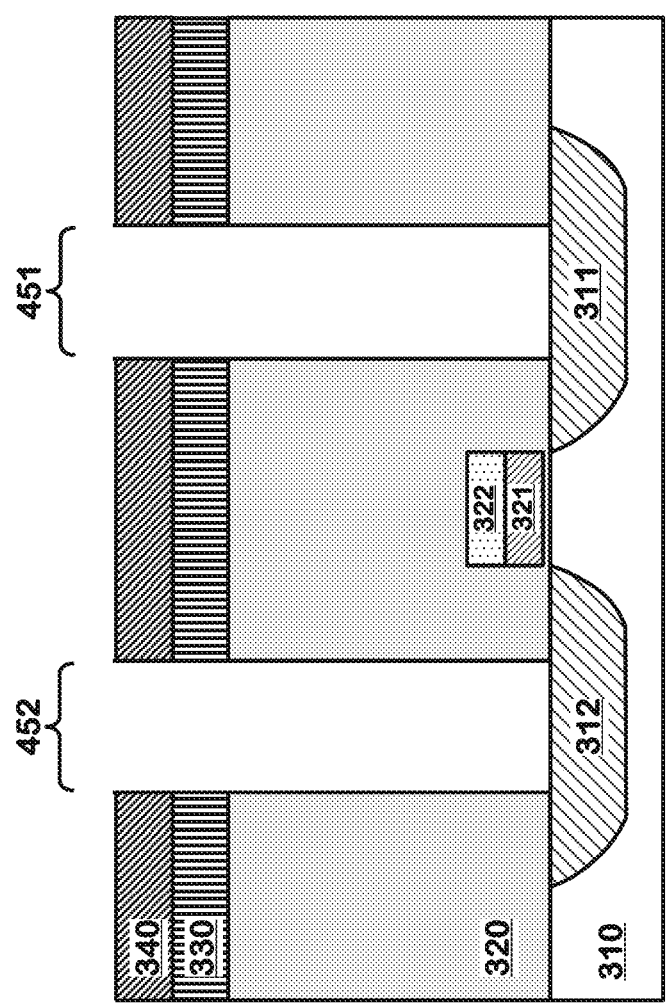
Figure 5:
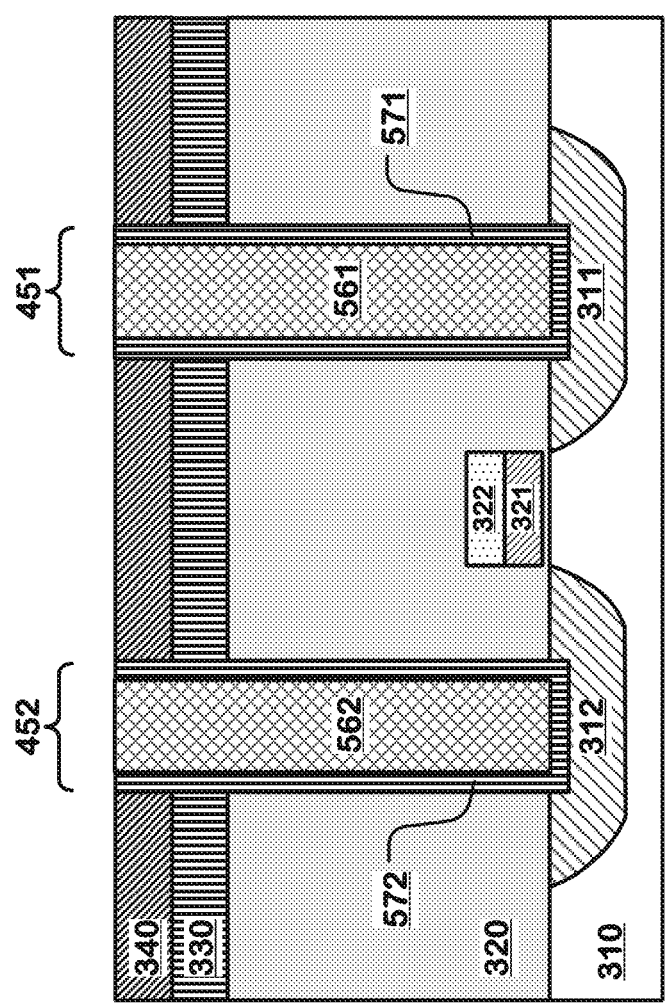

FIGS. 3-13 illustrate a method of manufacturing a memory cell in accordance with a first embodiment. The memory cell can comprise a plug extending upwardly from a top surface of a substrate through a dielectric layer; a bottom electrode having tungsten on an outside surface, the bottom electrode extending upwardly from a top surface of the plug; an insulating material in contact with the tungsten on the outside surface of, and surrounding, the bottom electrode; a memory element on an upper surface of the bottom electrode, the memory element comprising a tungsten oxide compound and programmable to at least two resistance states; and a top electrode overlying and contacting the memory element. FIGS. 3-5 illustrate example process steps used in forming a dielectric layer on a substrate, a sacrificial layer overlying the dielectric layer, a first via through the dielectric layer, and a plug in the first via.

FIG. 3 is a simplified cross-sectional view of a portion of an IC device structure 300, showing the result of forming a dielectric layer (e.g. 320) on a substrate (e.g. 310), a sacrificial layer (e.g. 330) overlying the dielectric layer, and a mask (e.g. 340) overlying the sacrificial layer. The dielectric layer can include oxide materials such as PE (plasma enhanced) oxide, PETEOS (plasma enhanced tetraethyl orthosilicate) oxide, LPTEOS low pressure tetraethyl orthosilicate) oxide, HDP (high density plasma) oxide, BPSG (borophosphosilicate glass film), PSG (phosphosilicate glass film), FSG (fluorosilicate glass film), low k materials and so on. The sacrificial layer can include TiN (titanium nitride) or TaN (tantalum nitride). The mask can include SiN (silicon nitride) or any material suitable for providing a higher selectivity for the sacrificial layer than for the mask.

An access device (e.g. 323) is formed on the substrate. The access device comprises a transistor having first and second doped regions (e.g. 311, 312), and a gate 321 connected to a word line 322.

FIG. 4 is a simplified cross-sectional view of a portion of an IC device structure, showing the result of etching through the sacrificial layer (e.g. 330) and the dielectric layer (e.g. 320) on the substrate (e.g. 310) to form first and second vias (e.g. 451, 452), stopping at the substrate over the first and second doped regions (e.g. 311, 312). The mask 340 has open etch regions over the first and second doped regions, and the etching step uses the open etch regions to form the first and second vias (e.g. 451, 452).

FIG. 5 is a simplified cross-sectional view of a portion of an IC device structure, showing the result of forming a barrier layer (e.g. 571) lining some or all of the first via (e.g. 451), and forming a plug (e.g. 561) in the first via. The barrier layer can comprise the same material as the sacrificial layer. The sacrificial layer can comprise a material that has good adhesion properties with tungsten deposition. The sacrificial layer can be removed in a selective etch along with the material of the barrier layer. For instance, steps to form the barrier layer can include cleaning the sidewall of the first via using Ar (argon) sputtering, depositing thin Ti by sputtering and TiN by CVD (chemical vapor deposition), depositing W (tungsten) by CVD, and removing W and TiN by CMP (chemical mechanical planarization). A barrier layer (e.g. 572) can also be formed lining some or all of the second via (e.g. 452). A second plug (e.g. 562) can be formed in the second via, extending upwardly from the top surface of the substrate through the dielectric layer.

Figure 6:
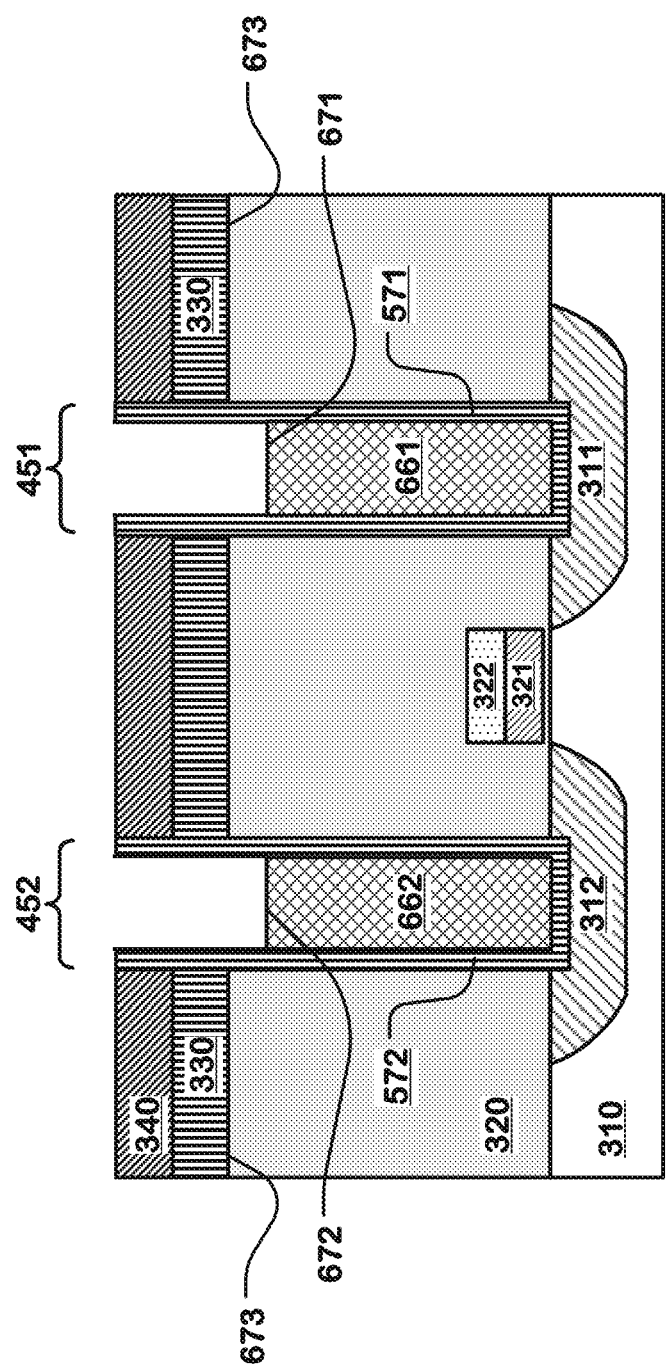

FIG. 6 is a simplified cross-sectional view of a portion of an IC device structure, showing the result of forming an opening through the sacrificial layer exposing a plug (e.g. 661). Forming an opening can include recessing the tungsten material in the first via to form the opening, and forming a top surface (e.g. 671) of the plug (e.g. 661) below a lower surface (e.g. 673) of the sacrificial layer (e.g. 330). The tungsten material can be recessed by RIE (reactive ion etching). The etch recipe can etch the tungsten material and the barrier layer. An etchant used in the etch recipe can be CF4, SF6 or chlorine based for example. The etching can reduce the height of the barrier layer (e.g. 571, 572) on the sidewalls of the plug and the second plug (e.g. 661, 662). However, remnants of the barrier layer (e.g. 571, 572) may remain above the top surface (e.g. 671, 672) of the plug and the second plug (e.g. 661, 662) due to the thin barrier layer, and depending on the etch selectivity of the etch recipes used.

In the second via, the tungsten material can also be recessed to form a second plug (e.g. 662), and a top surface of the second plug (e.g. 672) can be formed below a lower surface (e.g. 673) of the sacrificial layer (e.g. 330). The first and second doped regions (e.g. 311, 312) of the transistor in the access device are coupled to the tungsten material in the first via and the tungsten material in the second via respectively.

Figure 7:
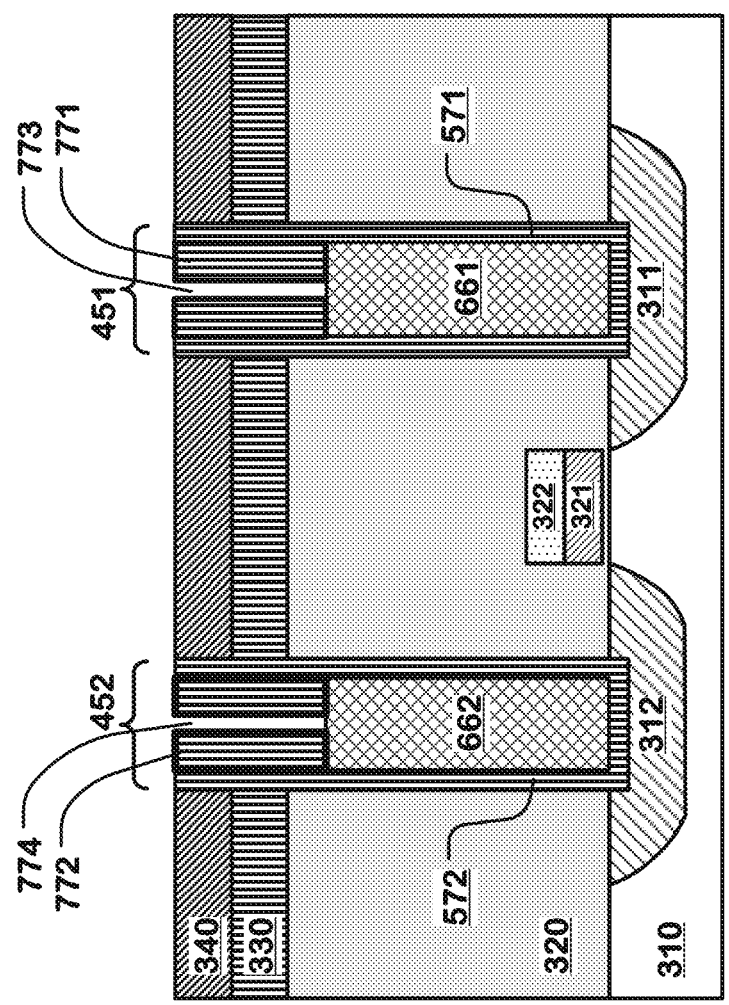
Figure 8:
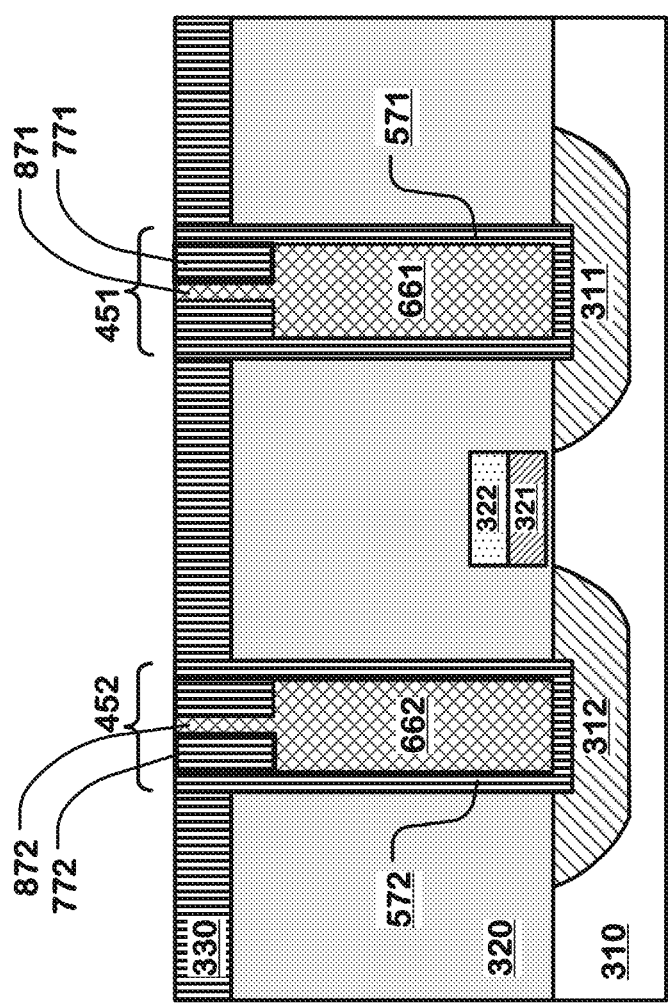

FIGS. 7-8 illustrate example process steps used in forming a bottom electrode inside the opening, where the bottom electrode can be tungsten or other material having tungsten on an outside surface, and extending upwardly from the top surface of the plug. The plug has a first lateral dimension (e.g. diameter), and the bottom electrode has a lateral dimension (e.g. diameter) parallel with the first lateral dimension of the plug that is less than the first lateral dimension. For instance, the bottom electrode can have a dimension between 5 nanometers and 50 nanometers.

FIG. 7 is a simplified cross-sectional view of a portion of an IC device structure, showing the result of forming a spacer (e.g. 771) in the first via (e.g. 451), the spacer defining a reduced dimension opening (e.g. 773) in the first via. For instance, the spacer can be formed by depositing a TiN or TaN layer using CVD (chemical vapor deposition) or ALD (atomic layer deposition), and then etching the TiN or TaN layer using RIE (reactive ion etching). An etch recipe used for TiN etch can include CHF3 to protect laterally etching profile, and CI2 as a major etching precursor. The etch recipe can have a higher selectivity for the TiN or TaN layer than for the tungsten material.

In one embodiment, forming a spacer can include forming a mask overlying the sacrificial layer, the mask having an open etch region over the first via; depositing a spacer layer (e.g. TiN) in the first via and on the mask; etching the spacer layer until the mask is exposed; and depositing an adhesion layer in the first via, the adhesion layer being thinner than the spacer layer. The reason for the adhesion layer is that a chemical vapor deposition of the tungsten material directly on the mask can cause peeling/delamination issue with the tungsten material. The adhesion layer can prevent the peeling/delamination issue, and keep the tungsten material in the reduced dimension opening (e.g. 773) in the first via to form the bottom electrode (e.g. 871, FIG. 8). The spacer layer and the adhesion layer can comprise the same material as the sacrificial layer, so they can be removed at a same process step later (e.g. FIG. 9). The adhesion layer can have a thickness between 0.5 nanometers and 5 nanometers.

In the second via (e.g. 452), a spacer (e.g. 772) can also be formed, the spacer defining a reduced dimension opening (e.g. 774) in the second via.

FIG. 8 is a simplified cross-sectional view of a portion of an IC device structure, showing the result of filling the reduced dimension opening (e.g. 773) in the first via (e.g. 451) through the sacrificial layer with the tungsten material, to form the bottom electrode (e.g. 871) on the top surface of the plug (e.g. 661). For instance, the reduced dimension opening in the first via can be filled with the tungsten material using CVD (chemical vapor deposition). The tungsten material is deposited over the adhesion layer in the first via. For instance, the bottom electrode can have a dimension between 5 nanometers and 50 nanometers. The reduced dimension opening (e.g. 774, FIG. 7) in the second via (e.g. 452) through the sacrificial layer can also be filled with the tungsten material, to form a conductive pillar (e.g. 872, FIG. 8) on the second plug (e.g. 662). The area of the tungsten material can vary based on process variations. In one embodiment, the tungsten material can have a composition of about 100%.

FIG. 8 also shows the result of removing the mask (e.g. 340, FIG. 7) and part of the tungsten material above the sacrificial layer in the first via. For instance, a chemical mechanical planarization process can be used to remove the portion of the tungsten material, using a recipe that has a higher selectivity for the tungsten material. A different chemical mechanical planarization process can be used to remove the mask, using a recipe that has a higher selectivity for the mask. Alternatively, a reactive ion etching (RIE) process can be used to remove the mask. The etchant in the RIE process can be NF3 or halogen etchants.

Figure 9:
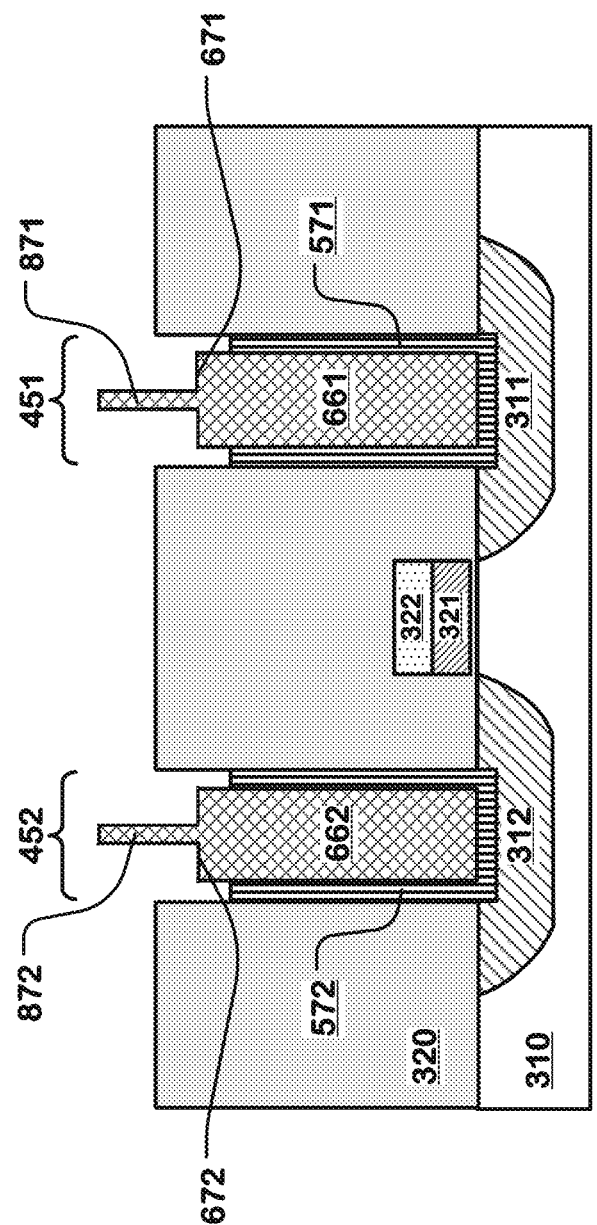

FIG. 9 is a simplified cross-sectional view of a portion of an IC device structure, showing the result of removing the sacrificial layer (e.g. 330, FIG. 8) overlying the dielectric layer, and the spacer (e.g. 771, 771, FIG. 8) in the first via and the second via (e.g. 451, 452). Part of the barrier layer 571 in the first via 451 is also removed, so that a top surface of the barrier layer 571 is lower than a top surface 671 of the plug 661. Part of the barrier layer 572 in the second via 452 is also removed, so that a top surface of the barrier layer 572 is lower than a top surface 672 of the second plug 662. However, because of the limited space between the plug 661 and the sidewall of the first via 451 and the limited space between the second plug 662 and the sidewall of the second via 452, remnants of the barrier layer 571 and the barrier layer 572 may remain in the limited spaces.

The sacrificial layer, the barrier layer, and the spacer can comprise a same material (e.g. TiN, TaN), or similar materials, so they can be removed at a same process step. This removing step can use a wet etch that has a higher selectivity for the material (e.g. TiN, TaN) in the sacrificial layer, the barrier layer, and the spacer than for the dielectric layer, the tungsten material in the bottom electrode and the plug in the first via, and the tungsten material in the conductive pillar and the second plug in the second via.

Figure 10:
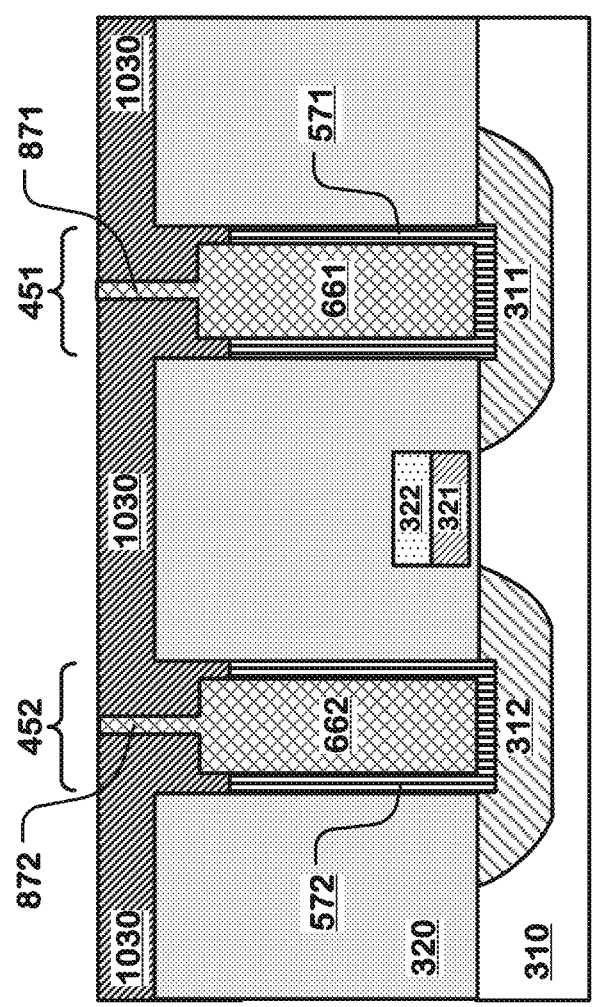

FIG. 10 is a simplified cross-sectional view of a portion of an IC device structure, showing the result of filling around the bottom electrode over the plug with an insulating material (e.g. 1030), over the dielectric layer (e.g. 320) and the first and second vias. In the first via (e.g. 451), the insulating layer separates the bottom electrode (e.g. 871) from the barrier layer (e.g. 571). In the second via (e.g. 452), the insulating layer separates the conductive pillar (e.g. 872) from the barrier layer (e.g. 572). For instance, the insulating layer can include HDP oxide, lower temperature oxide, or ALD (atomic layer deposition) oxide. Preferably the insulating layer is conformal to the top surface of the plug (e.g. 661), the sidewall of the bottom electrode (e.g. 871), and the top surface of the dielectric layer (e.g. 320).

Figure 11:
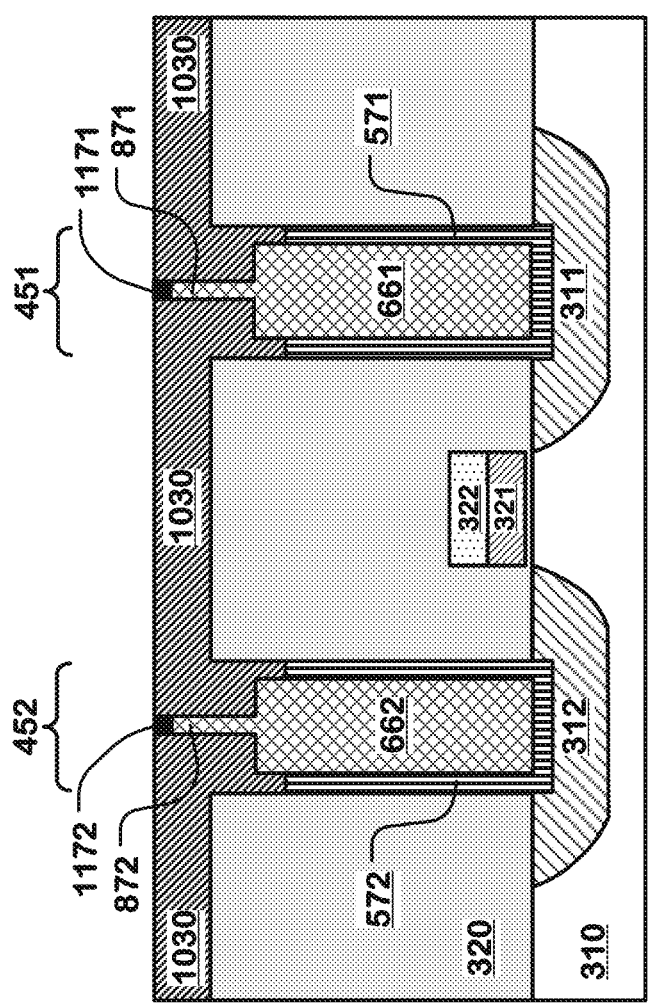

FIG. 11 is a simplified cross-sectional view of a portion of an IC device structure, showing the result of forming a memory element (e.g. 1171) on an upper surface of the bottom electrode. Forming a memory element can include oxidizing an upper surface of the bottom electrode (e.g. 871) to form the memory element (e.g. 1171) in the first via (e.g. 451). The memory element is physically separated from the barrier layer (e.g. 571) by the insulating material (e.g. 1030). The memory element comprises a tungsten oxide compound and programmable to at least two resistance states. Because the memory element is physically separated from the barrier layer by the insulating material, potential contamination from the material in the barrier layer (e.g. TiN, TaN) is eliminated. As a result, the memory element has no titanium or titanium compounds, and no tantalum or tantalum compounds. The bottom electrode also has no titanium or titanium compounds, and no tantalum or tantalum compounds, because the bottom electrode is physically separated from the barrier layer by the insulating material. An upper surface of the conductive pillar (e.g. 872) in the second via (e.g. 452) can also be oxidized to form a memory element (e.g. 1172) in the second via (e.g. 452).

Figure 12:
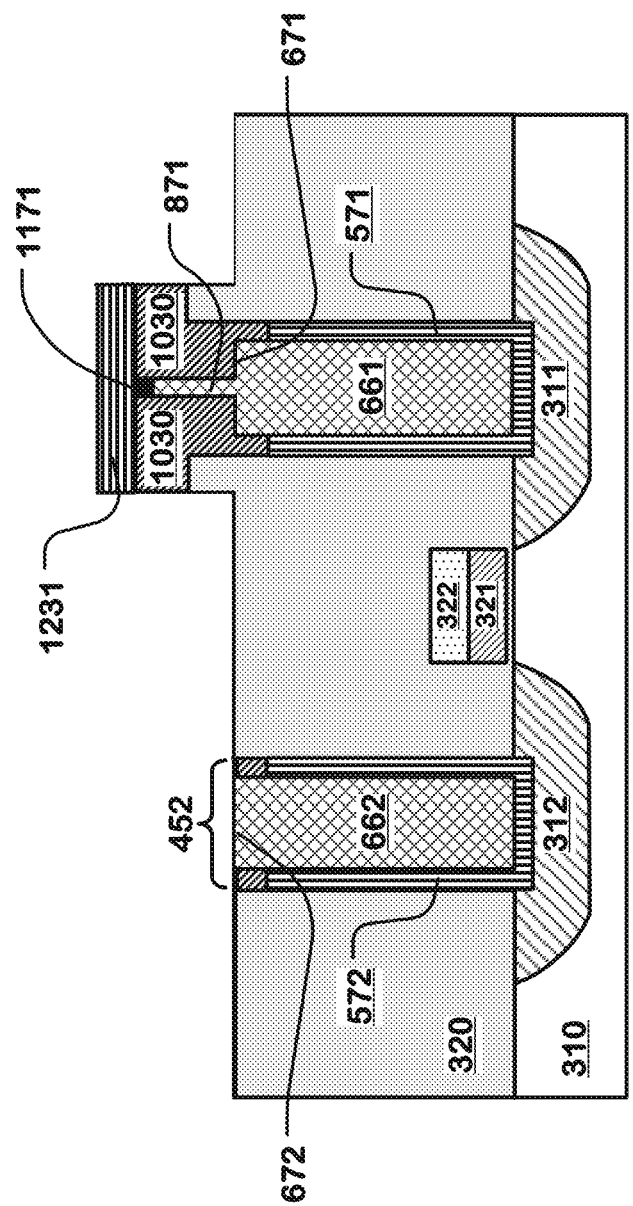

FIG. 12 is a simplified cross-sectional view of a portion of an IC device structure, showing the result of forming a top electrode (e.g. 1231) overlying and contacting the memory element (e.g. 1171) in the first via. Forming a top electrode can include forming a layer of conductive material over the insulating material; and patterning a layer of photoresist overlying the layer of conductive material, the patterned layer including a mask region over an area for the top electrode and an open etch region over a second via (e.g.

452). The bottom electrode is surrounded on its sides by an insulating material (e.g. 1030) between and contacting a top surface of the plug and a bottom surface of the top electrode (e.g. 1231). For instance, the conductive material of the top electrode can comprise TiN (titanium nitride).

A second plug (e.g. 662) in a second via (e.g. 452) can extend upwardly from the top surface of the substrate through the dielectric layer (e.g. 320). Forming a top electrode can include etching the layer of conductive material, the insulating material (e.g. 1030), and the dielectric layer (e.g. 320), using the patterned layer of photoresist, stopping at a top surface (e.g. 672) of the second plug (e.g. 662) in the second via. For instance, an RIE (reactive ion etching) process can be used at this etching step, using CF4 or SF6.

Figure 13:
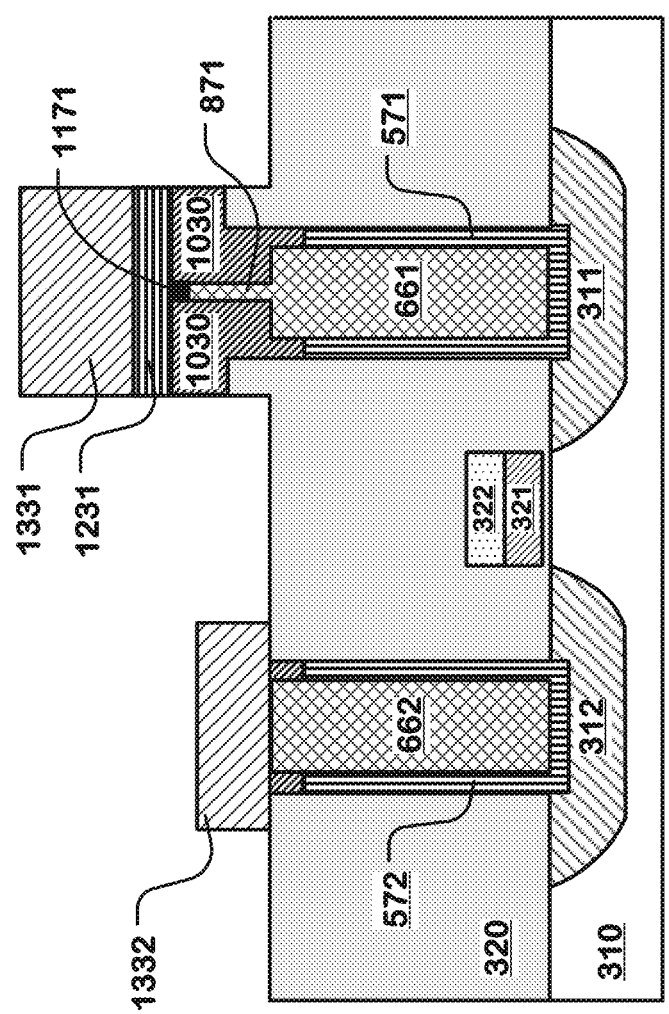

FIG. 13 is a simplified cross-sectional view of a portion of an IC device structure, showing the result of forming a bit line (e.g. 1331) overlying and contacting the top electrode (e.g. 1231). FIG. 13 also shows the result of forming a source line (e.g. 1332) overlying and contacting the second plug (e.g. 662) in the second via. For instance, the bit line can include materials such as TiN/Al/TiN, Al, TiN/Al, or thick TiN, and be disposed at a patterned metal layer. The source line can also include materials such as TiN/Al/TiN, Al, TiN/Al, or thick TiN, and be disposed at a same or a different patterned metal layer as the bit line.

As shown in the example of FIG. 13, a memory device is formed in accordance with a first embodiment. The memory device includes a plug (e.g. 661) extending upwardly from a top surface of a substrate (e.g. 310) through a dielectric layer (e.g. 320). The memory device includes a bottom electrode (e.g. 871) having tungsten on an outside surface, the bottom electrode extending upwardly from a top surface of the plug (e.g. 661). The memory device includes an insulating material (e.g. 1030) in contact with the tungsten on the outside surface of, and surrounding, the bottom electrode. This means there is no barrier or adhesion layer between the insulating material and the bottom electrode, and no barrier or adhesion layer contacting and contaminating the memory element. A barrier layer (e.g. 571) is disposed between the plug and the dielectric layer, and the bottom electrode is physically separated from the barrier layer by the insulating material. The barrier layer has a different material than the bottom electrode. The barrier layer can comprise TiN or TaN between the dielectric layer and the plug.

The plug has a first lateral dimension, and the bottom electrode has a lateral dimension parallel with the first lateral dimension of the plug that is less than the first lateral dimension. For instance, the bottom electrode can have a dimension between 5 nanometers and 50 nanometers.

The memory device includes a memory element (e.g. 1171) on an upper surface of the bottom electrode (e.g. 871), the memory element comprising a tungsten oxide compound and programmable to at least two resistance states. The tungsten oxide compound can comprise a layer formed by oxidation of the upper surface of the bottom electrode. The memory element is physically separated from the barrier layer by the insulating material, and potential contamination from the material in the barrier layer (e.g. TiN, TaN) is eliminated. As a result, the memory element has no titanium or titanium compounds, and no tantalum or tantalum compounds. The bottom electrode also has no titanium or titanium compounds, and no tantalum or tantalum compounds, because the bottom electrode is physically separated from the barrier layer by the insulating material.

The memory device includes a top electrode (e.g. 1231) overlying and contacting the memory element in the first via, wherein the bottom electrode is surrounded on its sides by the insulating material (e.g. 1030) between the top surface of the plug and a bottom surface of the top electrode (e.g. 1231). The memory device can include a bit line (e.g. 1331) overlying and contacting the top electrode (e.g. 1231).

The memory device can include an access device on the substrate, where the access device can comprise a transistor having first and second doped regions (e.g. 311, 312), and the first doped region can be coupled to the plug (e.g. 661).

The memory device can include a second plug (e.g. 662) being surrounded on its sides by a barrier layer, the second plug extending upwardly from the top surface of the substrate through the dielectric layer to contact a source line (e.g. 1332). The second plug can be coupled to the second doped region of the transistor. A barrier layer (e.g. 572) can surround the sides of the second plug through the dielectric layer. The barrier layer has a different material than the second plug.

FIGS. 14-22 illustrate a method of manufacturing a memory cell in accordance with a second embodiment. The memory cell can comprise a plug extending upwardly from a top surface of a substrate through a dielectric layer; a bottom electrode having tungsten on an outside surface, the bottom electrode extending upwardly from a top surface of the plug; an insulating material in contact with the tungsten on the outside surface of, and surrounding, the bottom electrode; a memory element on an upper surface of the bottom electrode, the memory element comprising a tungsten oxide compound and programmable to at least two resistance states; and a top electrode overlying and contacting the memory element.

Figure 14:
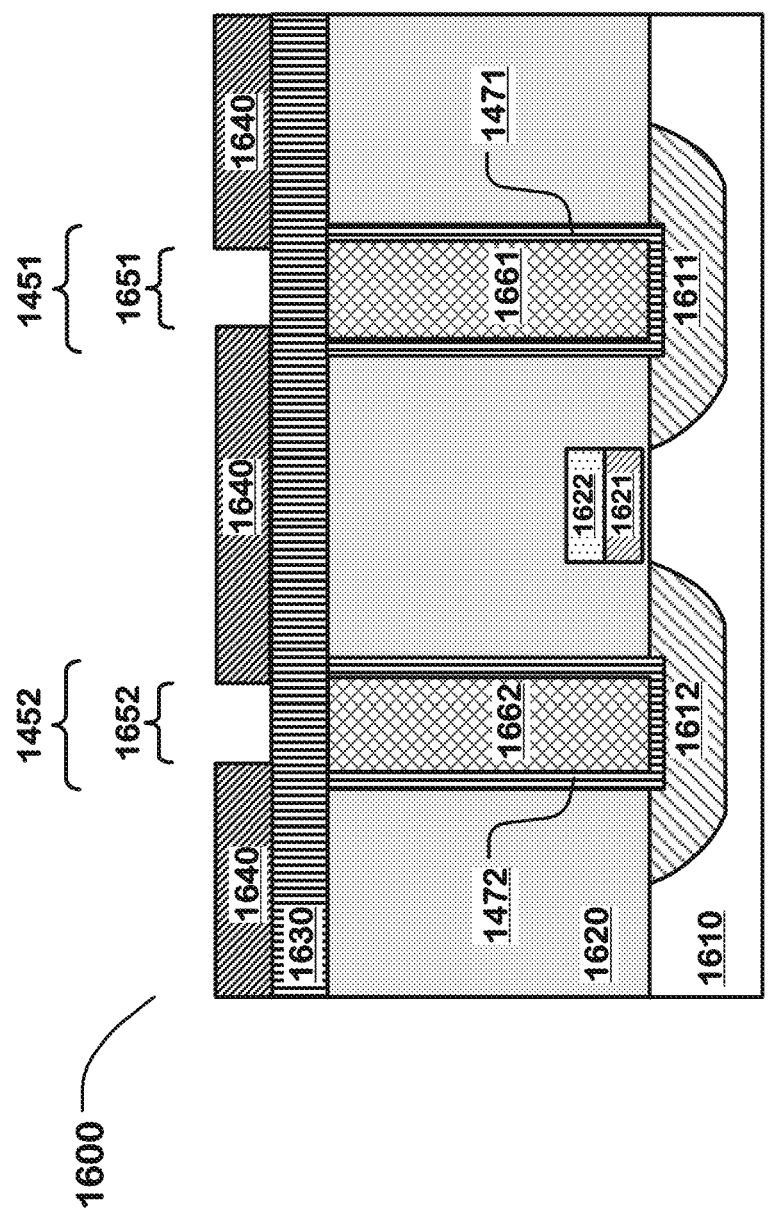
FIGS. 14-22 illustrate a method of manufacturing a memory cell including a memory element in accordance with a second embodiment, the memory element comprising a tungsten oxide compound and programmable to at least two resistance states.

FIG. 14 illustrates a simplified cross-sectional view of a portion of an IC device structure 1600, showing the result of forming a dielectric layer (e.g. 1620) on a substrate (e.g. 1610), a sacrificial layer (e.g. 1630) overlying the dielectric layer, a first via (e.g. 1451) through the dielectric layer, a barrier layer (e.g. 1471) lining some or all of the first via (e.g. 1451), and a plug (e.g. 1661) in the first via extending upwardly from the top surface of the substrate through the dielectric layer. The barrier layer can comprise the same material as the sacrificial layer. The sacrificial layer can comprise a material that has good adhesion properties with tungsten deposition. The sacrificial layer can be removed in a selective etch along with the material of the barrier layer. Materials for the dielectric layer and the sacrificial layer are as described in reference to FIG. 3.

A barrier layer (e.g. 1472) can be formed lining some or all of the second via (e.g. 1452). A second plug (e.g. 1662) can be formed in the second via (e.g. 1452), extending upwardly from the top surface of the substrate through the dielectric layer. An access device can be formed on the substrate, the access device comprising a transistor having first and second doped regions (e.g. 1611, 1612) coupled to the first mentioned plug (e.g. 1661) and the second plug (e.g. 1662) respectively. The transistor can have a gate (e.g. 1621) connected to a word line (e.g. 1622).

FIG. 14 also shows the result of forming a mask (e.g. 1640) over the sacrificial layer (e.g. 1630). The mask has an open etch region (e.g. 1651) over the first mentioned plug (e.g. 1661) and a second open etch region (e.g. 1652) over the second plug (e.g. 1662).

Figure 15:
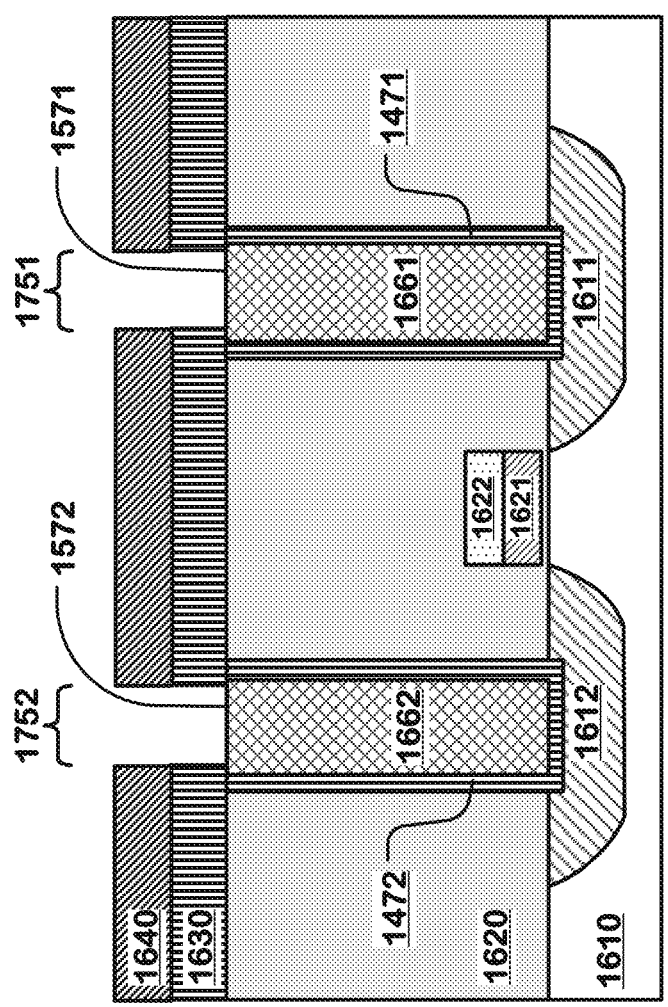

FIG. 15 is a simplified cross-sectional view of a portion of an IC device structure, showing the result of forming an opening through the sacrificial layer exposing the first mentioned plug. Forming an opening can include etching through the sacrificial layer to form the opening (e.g. 1751) over the first mentioned plug (e.g. 1661), using the mask, and to expose a top surface (e.g. 1571) of the plug (e.g. 1661). FIG. 15 also shows the result of etching through the sacrificial layer to form a second opening (e.g. 1752) over the second plug, using the mask and to expose a top surface (e.g. 1572) of the second plug (e.g. 1662).

Figure 16:
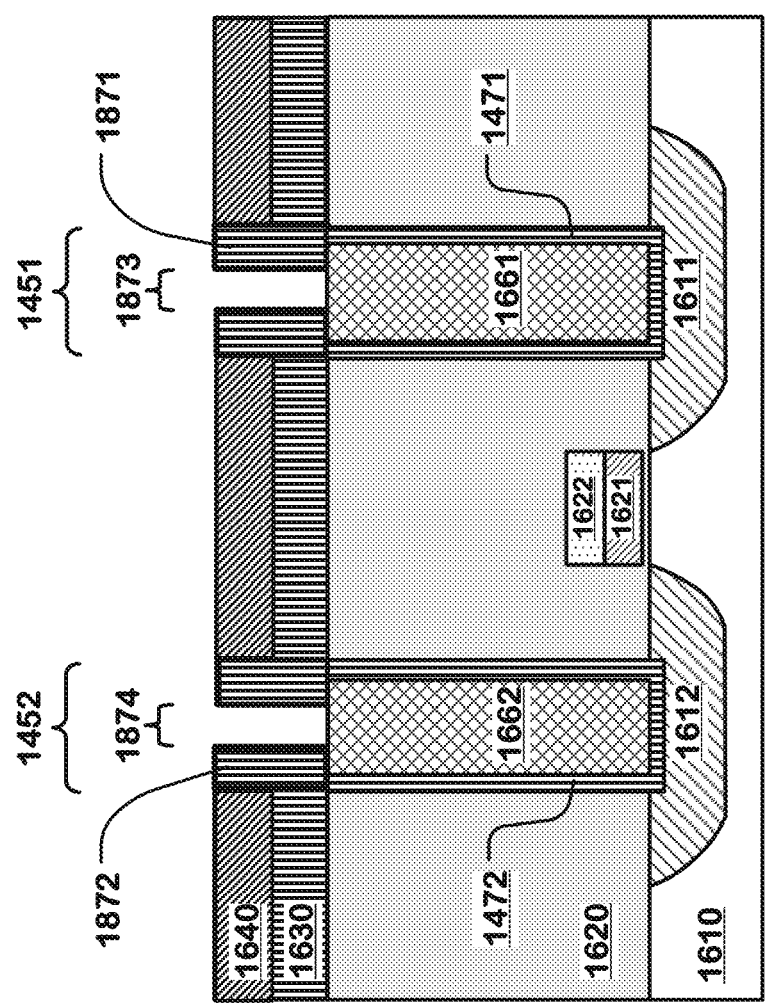
Figure 17:
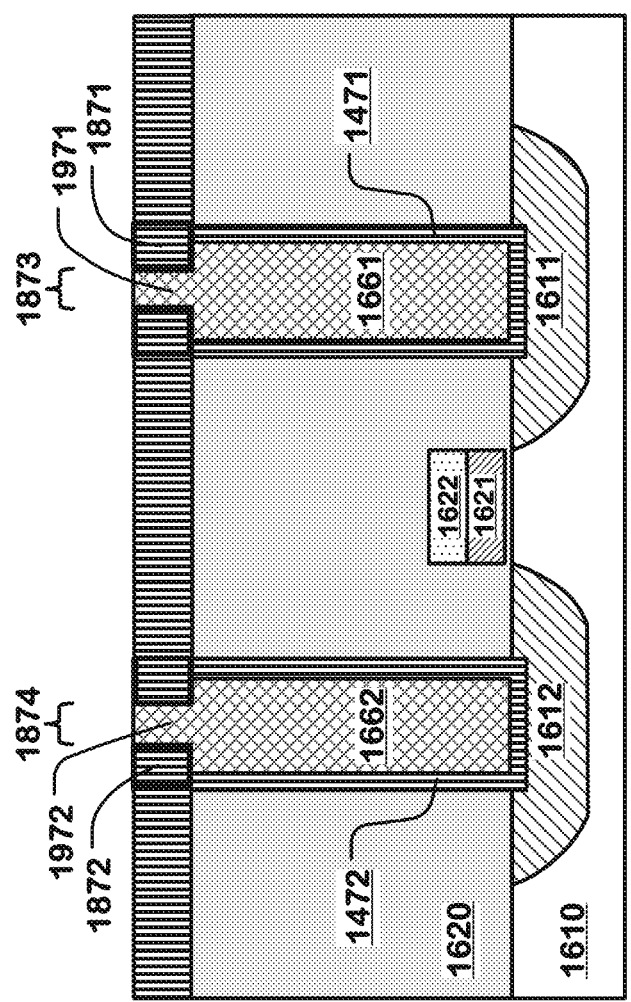

FIGS. 16-17 illustrate example process steps used in forming a bottom electrode inside the opening, where the bottom electrode can be tungsten or other material having tungsten on an outside surface, and extending upwardly from the top surface of the plug. The plug has a first lateral dimension (e.g. diameter), and the bottom electrode has a lateral dimension (e.g. diameter) parallel with the first lateral dimension of the plug that is less than the first lateral dimension. For instance, the bottom electrode can have a dimension between 5 nanometers and 50 nanometers.

FIG. 16 is a simplified cross-sectional view of a portion of an IC device structure, showing the result of forming a spacer (e.g. 1871) in the first via (e.g. 1451), the spacer defining a reduced dimension opening (e.g. 1873) in the first via. For instance, the spacer can be formed by depositing a TiN or TaN layer using CVD (chemical vapor deposition) or ALD (atomic layer deposition), and then etching the TiN or TaN layer using RIE (reactive ion etching). An etch recipe used for TiN etch can include CHF3 to protect laterally etching profile, and Cl2 as a major etching precursor. The etch recipe can have a higher selectivity for the TiN or TaN layer than for the tungsten material.

In one embodiment, forming a spacer can include forming a mask overlying the sacrificial layer, the mask having an open etch region over the first via; depositing a spacer layer in the first via and on the mask; etching the spacer layer until the mask is exposed; and depositing an adhesion layer in the first via, the adhesion layer being thinner than the spacer layer. The reason for the adhesion layer is that a chemical vapor deposition of the tungsten material directly on the mask can cause peeling/delamination issue with the tungsten material. The adhesion layer can prevent the peeling/delamination issue, and keep the tungsten material in the reduced dimension opening (e.g. 1873) in the first via to form the bottom electrode (e.g. 1971, FIG. 17). The spacer layer and the adhesion layer can comprise the same material as the sacrificial layer, so they can be removed at a same process step later (e.g. FIG. 18). The adhesion layer can have a thickness between 0.5 nanometers and 5 nanometers.

In the second via (e.g. 1452), a spacer (e.g. 1872) can also be formed, the spacer defining a reduced dimension opening (e.g. 1874) in the second via.

FIG. 17 is a simplified cross-sectional view of a portion of an IC device structure, showing the result of filling the reduced dimension opening (e.g. 1873) in the first via through the sacrificial layer with the tungsten material, to form the bottom electrode (e.g. 1971) on the top surface of the plug (e.g. 1661). For instance, the reduced dimension opening in the first via can be filled with the tungsten material using CVD (chemical vapor deposition). The tungsten material is deposited over the adhesion layer in the first via. For instance, the bottom electrode can have a dimension between 5 nanometers and 50 nanometers. The reduced dimension opening (e.g. 1874) in the second via through the sacrificial layer can also be filled with the tungsten material, to form a conductive pillar (e.g. 1972) on the top surface of the second plug (e.g. 1662).

FIG. 17 also shows the result of removing the mask (e.g. 1640, FIG. 16) and part of the tungsten material above the sacrificial layer in the first via. For instance, a chemical mechanical planarization process can be used to remove the portion of the tungsten material, using a recipe that has a higher selectivity for the tungsten material. A different chemical mechanical planarization process can be used to remove the mask, using a recipe that has a higher selectivity for the mask. Alternatively, a reactive ion etching (RIE) process can be used to remove the mask. The etchant in the RIE process can be NF3 or halogen etchants.

Figure 18:
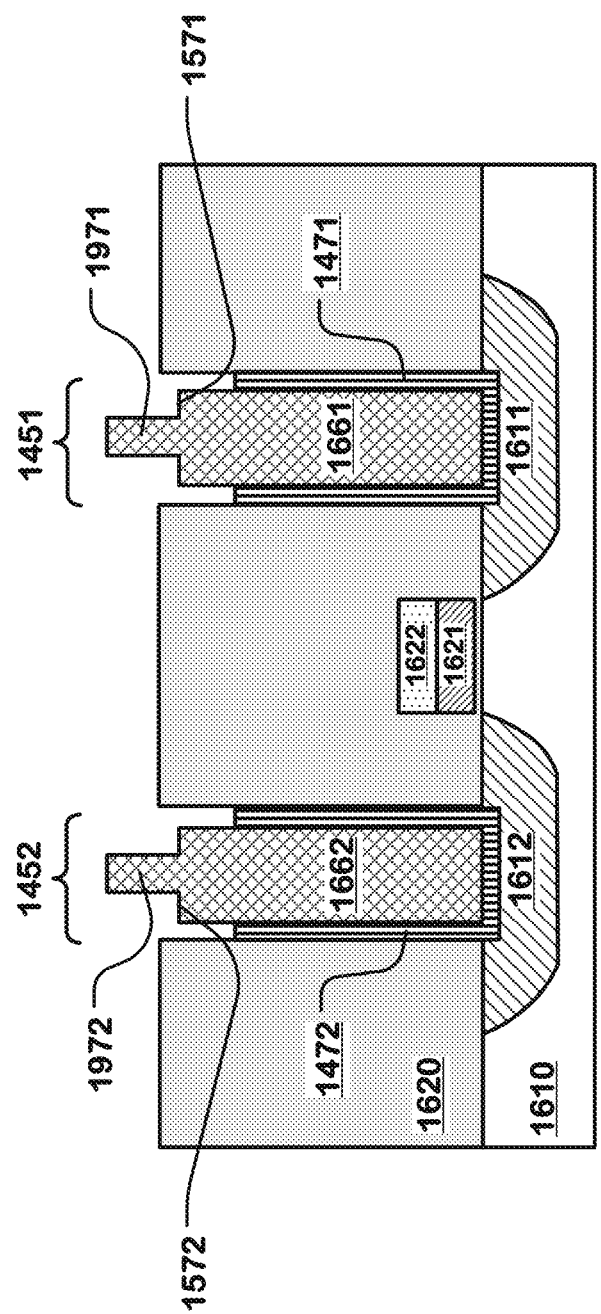

FIG. 18 is a simplified cross-sectional view of a portion of an IC device structure, showing the result of removing the sacrificial layer (e.g. 1630, FIG. 17), and the spacer (e.g. 1871, 1872, FIG. 17) in the first via and the second via (e.g. 1451, 1452). Part of the barrier layer 1471 in the first via 1451 is also removed, so that a top surface of the barrier layer 1471 is lower than a top surface 1571 of the plug 1661. Part of the barrier layer 1472 in the second via 1452 is also removed, so that a top surface of the barrier layer 1472 is lower than a top surface 1572 of the second plug 1662. However, because of the limited space between the plug 1661 and the sidewall of the first via 1451 and the limited space between the second plug 1662 and the sidewall of the second via 1452, remnants of the barrier layer 1471 and the barrier layer 1472 may remain in the limited spaces.

The sacrificial layer, the barrier layer, and the spacer comprise a same material (e.g. TiN, TaN), or similar materials, so they can be removed at a same process step. This removing step can use a wet etch that has a higher selectivity for the material (e.g. TiN, TaN) in the sacrificial layer and the spacer than for the dielectric layer, the tungsten material in the bottom electrode and the plug in the first via, and the tungsten material in the conductive pillar and the second plug in the second via.

Figure 19:
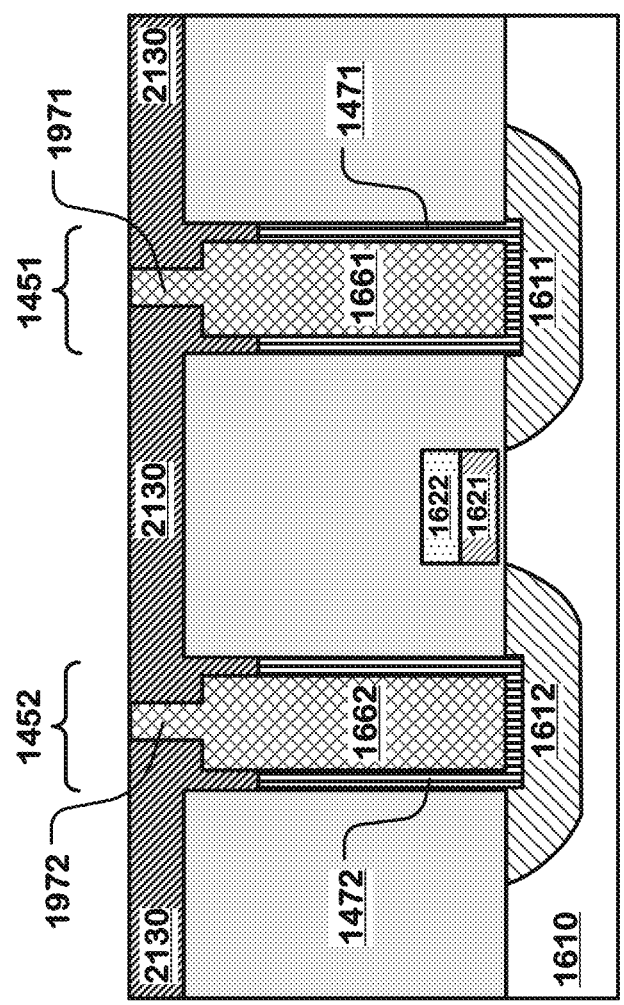

FIG. 19 is a simplified cross-sectional view of a portion of an IC device structure, showing the result of filling around the bottom electrode over the plug with an insulating material (e.g. 2130) over the dielectric layer (e.g. 1620) and the first and second vias. In the first via (e.g. 1451), the insulating layer separates the bottom electrode (e.g. 1971) from the barrier layer (e.g. 1471). In the second via (e.g. 1452), the insulating layer separates the conductive pillar (e.g. 1972) from the barrier layer (e.g. 1472). For instance, the insulating layer can include HDP oxide, lower temperature oxide, or ALD (atomic layer deposition) oxide. Preferably the insulating layer is conformal to the top surface of the plug (e.g. 1661), the sidewall of the bottom electrode (e.g. 1971), and the top surface of the dielectric layer (e.g. 1620).

Figure 20:
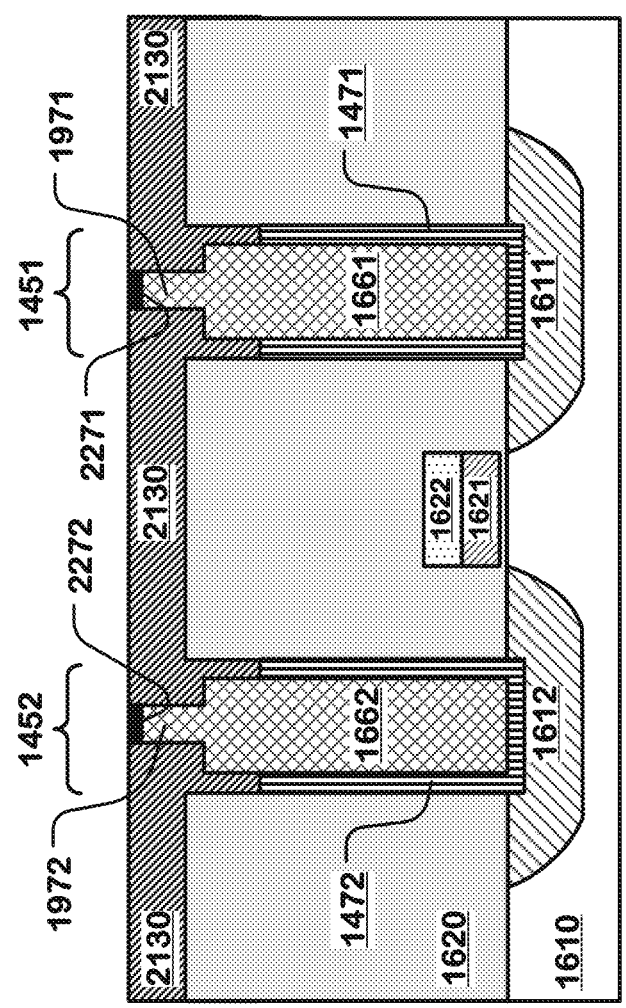

FIG. 20 is a simplified cross-sectional view of a portion of an IC device structure, showing the result of forming a memory element on an upper surface of the bottom electrode. Forming a memory element can include oxidizing an upper surface of the bottom electrode (e.g. 1971) to form a memory element (e.g. 2271) in the first via (e.g. 1451). The memory element is physically separated from the barrier layer (e.g. 1471) by the insulating material (e.g. 2130). The memory element comprises a tungsten oxide compound and programmable to at least two resistance states. Because the memory element is physically separated from the barrier layer by the insulating material, potential contamination from the material in the barrier layer (e.g. TiN, TaN) is eliminated. As a result, the memory element has no titanium or titanium compounds, and no tantalum or tantalum compounds. The bottom electrode also has no titanium or titanium compounds, and no tantalum or tantalum compounds, because the bottom electrode is physically separated from the barrier layer by the insulating material. An upper surface of the conductive pillar (e.g. 1972) in the second via can also be oxidized to form a memory element (e.g. 2272).

Figure 21:
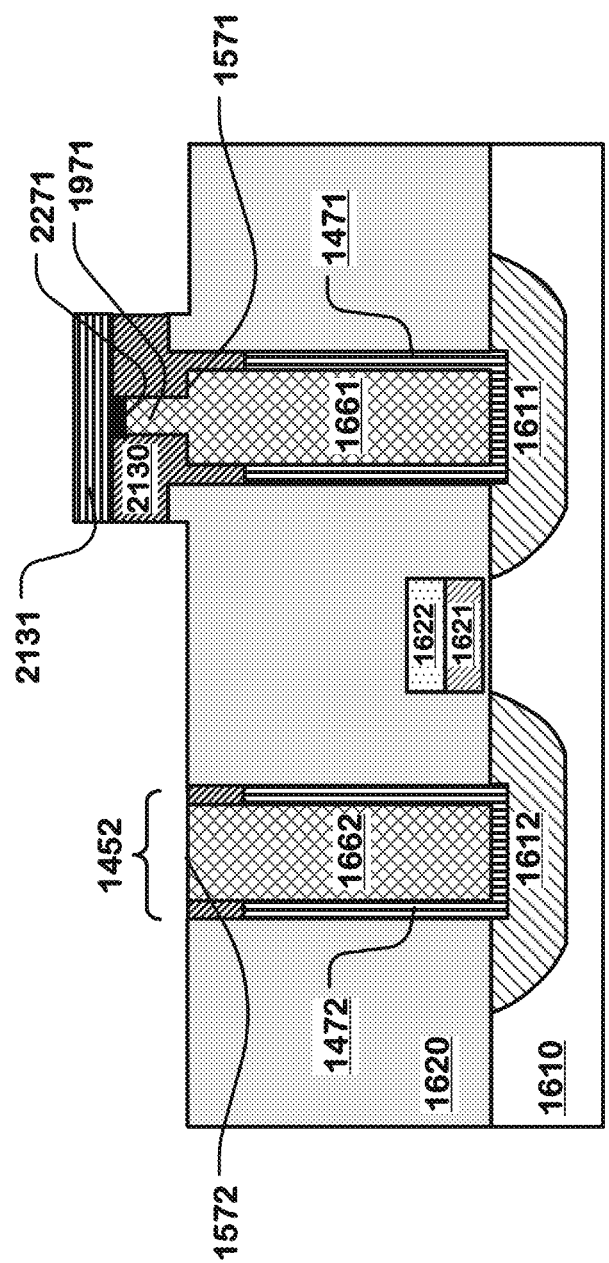

FIG. 21 is a simplified cross-sectional view of a portion of an IC device structure, showing the result of forming a top electrode (e.g. 2131) overlying and contacting the memory element (e.g. 2271) in the first via. Forming a top electrode can include forming a layer of conductive material over the insulating layer; and patterning a layer of photoresist overlying the layer of conductive material, the patterned layer including a mask region over an area for the top electrode and an open etch region over a second via (e.g. 1452). The bottom electrode is surrounded on its sides by an insulating material (e.g. 2130) between and contacting a top surface of the plug (e.g. 1661) and a bottom surface of the top electrode (e.g. 2131). For instance, the conductive material of the top electrode can comprise TiN (titanium nitride).

A second plug (e.g. 1662) in a second via (e.g. 1452) can extend upwardly from the top surface of the substrate through the dielectric layer (e.g. 1620). Forming a top electrode can include etching the layer of conductive material, the insulating material (e.g. 2130), and the dielectric layer (e.g. 1620), using the patterned layer of photoresist, stopping at a top surface (e.g. 1772) of the second plug (e.g. 1662). For instance, an RIE (reactive ion etching) process can be used at this etching step, using CF4 or SF6.

Figure 22:
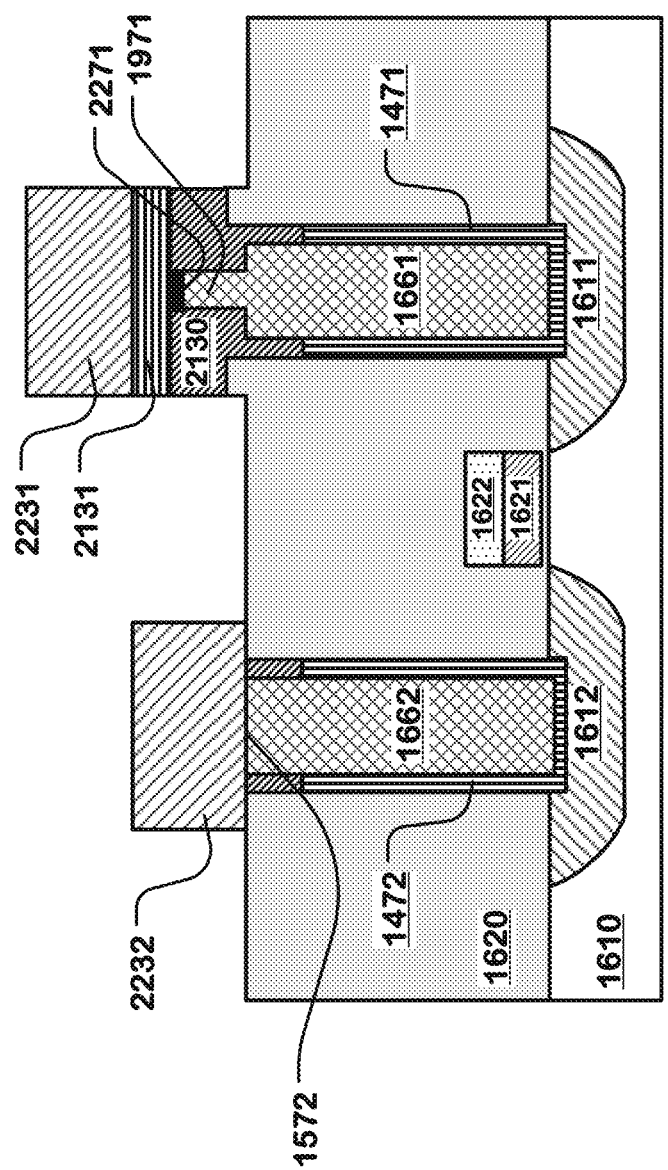

FIG. 22 is a simplified cross-sectional view of a portion of an IC device structure, showing the result of forming a bit line (e.g. 2231) overlying and contacting the top electrode (e.g. 2131). FIG. 22 also shows the result of forming a source line (e.g. 2232) overlying and contacting the second plug (e.g. 1662) in the second via. For instance, the bit line can include materials such as TiN/Al/TiN, Al, TiN/Al, or thick TiN, and be disposed at a same or a different patterned metal layer as the bit line.

As shown in the example of FIG. 22, a memory device is formed in accordance with a second embodiment. The memory device includes a plug (e.g. 1661) extending upwardly from a top surface of a substrate (e.g. 1610) through a dielectric layer (e.g. 1620). The memory device includes a bottom electrode (e.g. 1971) having tungsten on an outside surface, the bottom electrode extending upwardly from a top surface of the plug (e.g. 1661). The memory device includes an insulating material (e.g. 2130) in contact with the tungsten on the outside surface of, and surrounding, the bottom electrode. This means there is no barrier or adhesion layer between the insulating material and the bottom electrode, and no barrier or adhesion layer contacting and contaminating the memory element. A barrier layer (e.g. 1471) is disposed between the plug and the dielectric layer, and the bottom electrode is physically separated from the barrier layer by the insulating material. The barrier layer has a different material than the bottom electrode. The barrier layer can comprise TiN or TaN between the dielectric layer and the plug.

The plug has a first lateral dimension, and the bottom electrode has a lateral dimension parallel with the first lateral dimension of the plug that is less than the first lateral dimension. For instance, the bottom electrode can have a dimension between 5 nanometers and 50 nanometers.

The memory device includes a memory element (e.g. 2271) on an upper surface of the bottom electrode (e.g. 1971), the memory element comprising a tungsten oxide compound and programmable to at least two resistance states. The tungsten oxide compound can comprise a layer formed by oxidation of the upper surface of the bottom electrode. The memory element is physically separated from the barrier layer by the insulating material, and potential contamination from the material in the barrier layer (e.g. TiN, TaN) is eliminated. As a result, the memory element has no titanium or titanium compounds, and no tantalum or tantalum compounds. The bottom electrode also has no titanium or titanium compounds, and no tantalum or tantalum compounds, because the bottom electrode is physically separated from the barrier layer by the insulating material.

The memory device includes a top electrode (e.g. 2131) overlying and contacting the memory element, wherein the bottom electrode is surrounded on its sides by the insulating material (e.g. 2130) between the top surface of the plug and a bottom surface of the top electrode (e.g. 2131). The memory device can include a bit line (e.g. 2231) overlying and contacting the top electrode (e.g. 2131).

The memory device can include an access device on the substrate, where the access device can comprise a transistor having first and second doped regions (e.g. 1611, 1612), and the first doped region can be coupled to the plug (e.g. 1661).

The memory device can include a second plug (e.g. 1662) extending upwardly from the top surface of the substrate through the dielectric layer to contact a source line (e.g. 2232). The second plug can be coupled to the second doped region of the transistor. A barrier layer (e.g. 1472) can surround the sides of the second plug through the dielectric layer. The barrier layer has a different material than the second plug.

Figure 23:
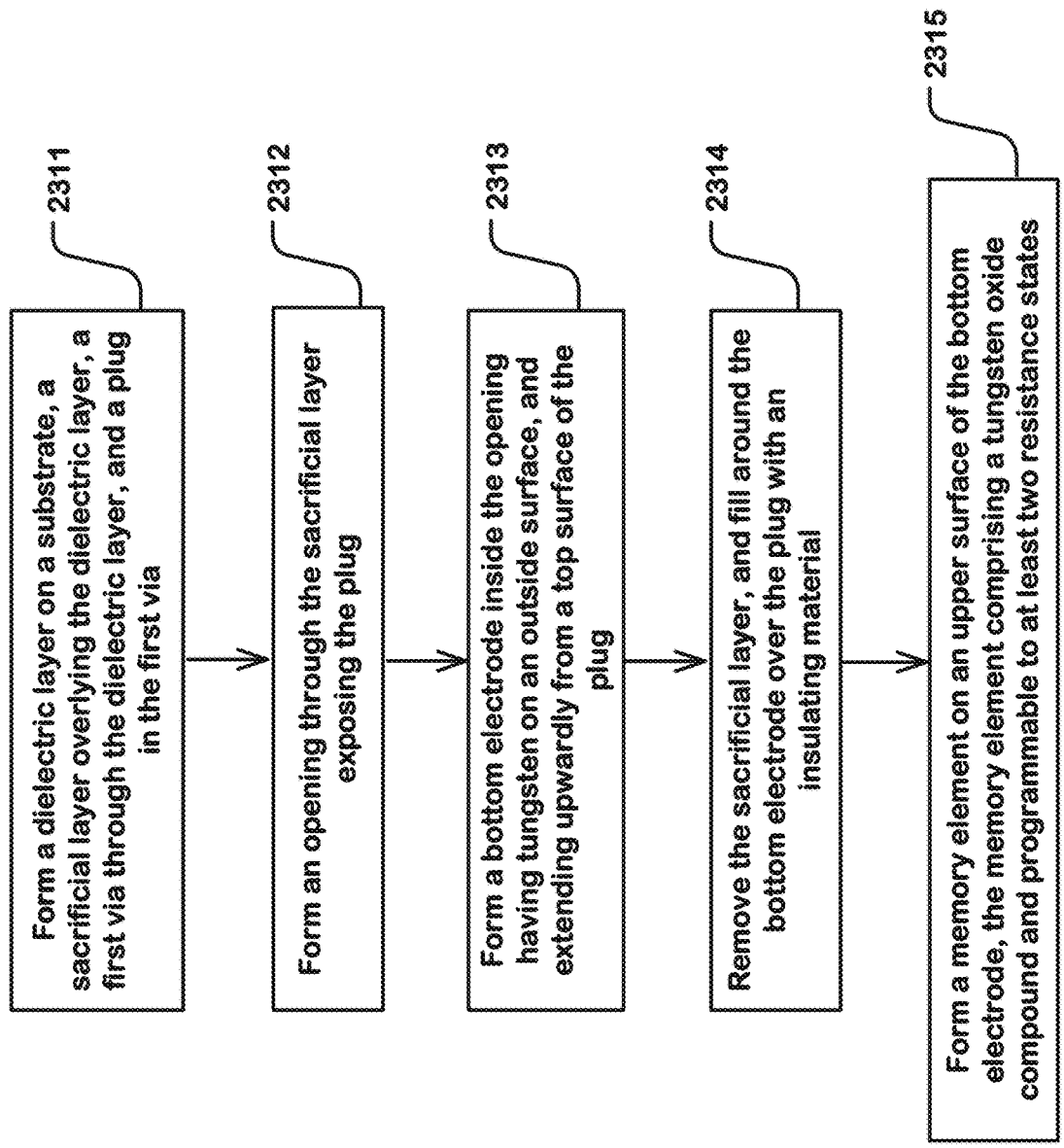
FIG. 23 illustrates a simplified flowchart for manufacturing a memory cell.

FIG. 23 illustrate a simplified flowchart for manufacturing a memory cell. At Step 2311, a dielectric layer is formed on a substrate, a sacrificial layer is formed overlying the dielectric layer, a first via is formed through the dielectric layer, and a plug is formed in the first via. This step is further described in reference to FIGS. 3-5 and 14.

At Step 2312, an opening is formed through the sacrificial layer exposing the plug. This step is further described in reference to FIGS. 6 and 14-15. As shown in the example of FIG. 6, forming an opening in the sacrificial layer can include forming the first via through the sacrificial layer, and recessing the tungsten material in the first via to form the opening. The recessing step includes forming a top surface of the plug below a lower surface of the sacrificial layer. As shown in the example of FIGS. 14-15, forming an opening in the sacrificial layer can include forming a mask over the sacrificial layer, the mask having an open etch region over the plug; and etching through the sacrificial layer to form the opening over the plug, using the mask, and to expose a top surface of the plug.

At Step 2313, a bottom electrode is formed inside the opening having tungsten on an outside surface, and extending upwardly from a top surface of the plug. This step is further described in reference to FIGS. 7-8 and 16-17. As shown in the example of FIGS. 8 and 17, the plug has a first lateral dimension, and the bottom electrode has a lateral dimension parallel with the first lateral dimension of the plug that is less than the first lateral dimension.

At Step 2314, the sacrificial layer is removed, and the bottom electrode is filled around over the plug with an insulating material. This step is further described in reference to FIGS. 9-10 and 18-19.

At Step 2315, a memory element is formed on an upper surface of the bottom electrode. The memory element comprises a tungsten oxide compound and programmable to at least two resistance states. This step is further described in reference to FIGS. 11 and 20.

In one embodiment, a barrier layer can be formed lining some or all of the first via, wherein the memory element is physically separated from the barrier layer by the insulating material. The barrier layer can comprise the same material as the sacrificial layer, and the step to remove the sacrificial layer can use an etch process that removes a portion of the barrier layer in the first via. The barrier layer is described in reference to FIGS. 5-13.

Also, a second via can be formed through the dielectric layer, and a second plug can be formed in the second via. An access device can be formed on the substrate, the access device comprising a transistor having first and second doped regions coupled to the tungsten material in the first via and the tungsten material in the second via respectively.

Figure 24:
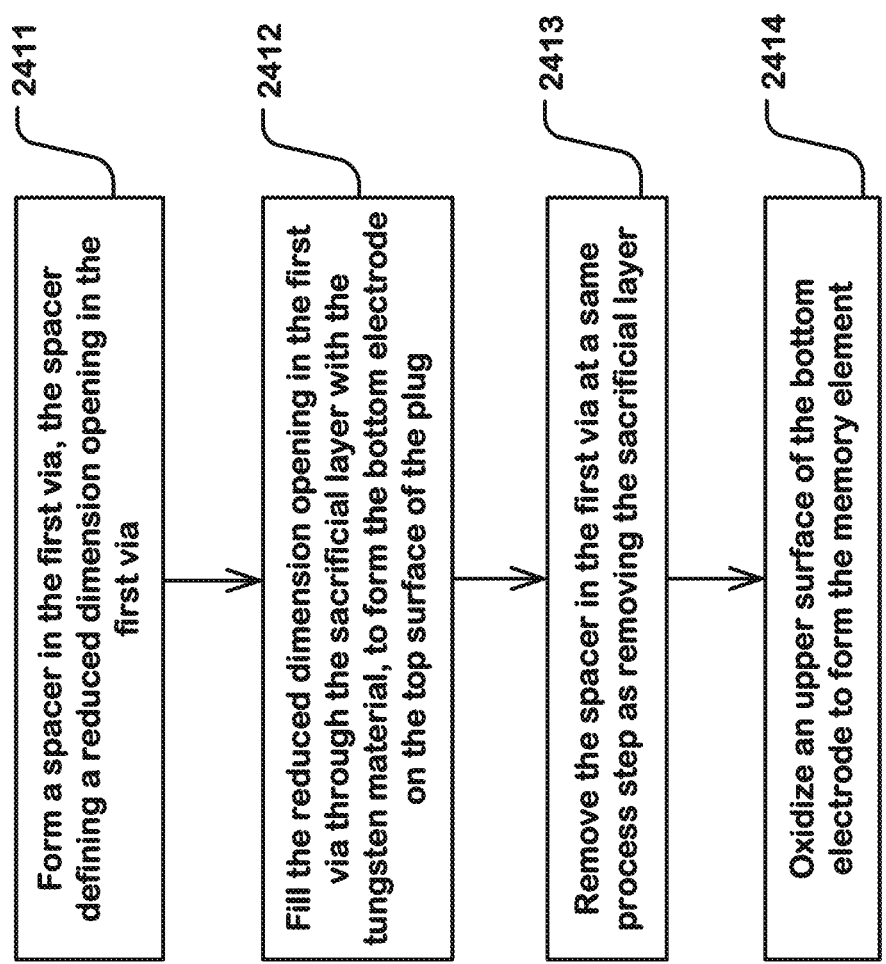
FIG. 24 further illustrates process steps in the flowchart shown in FIG. 23.

FIG. 24 further illustrates process steps in the flowchart shown in FIG. 23. At Step 2411, a spacer is formed in the first via, the spacer defining a reduced dimension opening in the first via. The spacer can comprise the same material as the sacrificial layer. The spacer can comprise at least one of TiN and TaN. This allows formation of the tungsten material between the spacers without need of additional deposition steps to line the spacers with an adhesion/barrier material.

Forming the spacer can include forming a mask overlying the sacrificial layer, the mask having an open etch region over the first via; depositing a spacer layer in the first via and on the mask; etching the spacer layer until the mask is exposed; and depositing an adhesion layer in the first via, the adhesion layer being thinner than the spacer layer. For instance, the adhesion layer can have a thickness between 0.5 nanometers and 5 nanometers. The spacer layer and the adhesion layer can comprise the same material as the sacrificial layer, so they can be removed at a same process step later.

At Step 2412, the reduced dimension opening in the first via through the sacrificial layer is filled with the tungsten material, to form the bottom electrode on the top surface of the plug. At Step 2413, the spacer in the opening is removed at a same process step as removing the sacrificial layer (e.g. Step 2314, FIG. 23). At Step 2414, an upper surface of the bottom electrode is oxidized to form the memory element. Steps illustrated in the flowchart in FIG. 24 are further described in reference to FIGS. 7-11 and 16-20.

Further process steps can include forming a top electrode overlying and contacting the memory element, and forming a bit line overlying and contacting the top electrode, as described in reference to FIGS. 12-13 and 21-22.

With all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

Although examples described herein use a tungsten oxide compound for a memory element and a tungsten material for a bottom electrode in a memory cell, the memory element can include other compounds compatible with the tungsten material for a bottom electrode.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
 a plug extending upwardly from a top surface of a substrate through a dielectric layer;
 a bottom electrode having tungsten on an outside surface, the bottom electrode extending upwardly from a top surface of the plug;
 an insulating material in contact with the tungsten on the outside surface of, and surrounding, the bottom electrode;
 a memory element on an upper surface of the bottom electrode, the memory element comprising a tungsten oxide compound and programmable to at least two resistance states;
 a top electrode overlying and contacting a top surface of the memory element and a top surface of the insulating material;
 a second plug extending upwardly from the top surface of the substrate through the dielectric layer to contact a source line; and
 a barrier layer between the second plug and the dielectric layer, the source line overlying and contacting a top surface of the second plug and a top surface of the dielectric layer and being insulated from the barrier layer.

2. The memory device of claim 1, including a barrier layer comprising TiN or TaN between the dielectric layer and the plug.

3. The memory device of claim 1, the tungsten oxide compound comprising a layer formed by oxidation of the upper surface of the bottom electrode.

4. The memory device of claim 1, wherein the plug has a first lateral dimension, and the bottom electrode has a lateral dimension parallel with the first lateral dimension of the plug that is less than the first lateral dimension.

5. The memory device of claim 1, comprising:
 an access device on the substrate, the access device comprising a transistor having first and second doped regions, the first doped region coupled to the plug,
 the second plug coupled to the second doped region of the transistor.

6. The memory device of claim 1, the memory element having no titanium or titanium compounds.

7. The memory device of claim 1, further comprising bias circuitry adapted to apply a bias arrangement to the memory element for storing a data value, wherein the bias arrangement for storing the data value comprises a sequence of pulses adapted to set the resistance state of the memory element to a resistance corresponding to the data value.

8. A memory device, comprising:
 a plug extending upwardly from a top surface of a substrate through a dielectric layer;
 a bottom electrode having tungsten on an outside surface, the bottom electrode extending upwardly from a top surface of the plug;
 an insulating material in contact with the tungsten on the outside surface of, and surrounding, the bottom electrode;
 a memory element on an upper surface of the bottom electrode, the memory element comprising a tungsten oxide compound and programmable to at least two resistance states;
 a top electrode overlying and contacting a top surface of the memory element and a top surface of the insulating material;

a barrier layer between the plug and the dielectric layer, and the bottom electrode being physically separated from the barrier layer by the insulating material;

a second plug extending upwardly from the top surface of the substrate through the dielectric layer to contact a source line; and a second barrier layer between the second plug and the dielectric layer, the source line overlying and contacting a top surface of the second plug and a top surface of the dielectric layer and being insulated from the second barrier layer.

9. The memory device of claim 8, wherein the barrier layer has a different material than the bottom electrode.

10. A method of manufacturing a memory cell, comprising:

forming a dielectric layer on a substrate, a sacrificial layer overlying the dielectric layer, a first via through the dielectric layer, and a plug in the first via;

forming an opening through the sacrificial layer exposing the plug;

forming a bottom electrode inside the opening having tungsten on an outside surface, and extending upwardly from a top surface of the plug;

removing the sacrificial layer, and filling around the bottom electrode over the plug with an insulating material;

forming a memory element on an upper surface of the bottom electrode, the memory element comprising a tungsten oxide compound and programmable to at least two resistance states;

forming a top electrode overlying and contacting a top surface of the memory element and a top surface of the insulating material;

forming a spacer in the first via, the spacer defining a reduced dimension opening in the first via;

filling the reduced dimension opening in the first via through the sacrificial layer with tungsten material, to form the bottom electrode on the top surface of the plug;

removing the spacer in the first via at a same process step as said removing the sacrificial layer; and oxidizing an upper surface of the bottom electrode to form the memory element.

11. The method of claim 10, wherein forming an opening in the sacrificial layer includes forming the first via through the sacrificial layer, and recessing the plug in the first via to form the opening.

12. The method of claim 11, wherein said recessing includes forming a top surface of the plug below a lower surface of the sacrificial layer.

13. The method of claim 10, comprising:

forming a barrier layer lining at least some of the first via, wherein the memory element is physically separated from the barrier layer by the insulating material.

14. The method of claim 10, comprising:

forming a barrier layer lining at least some of the first via, wherein the barrier layer comprises the same material as the sacrificial layer, and said removing the sacrificial layer uses an etch process that removes a portion of the barrier layer in the first via.

15. The method of claim 10, wherein forming an opening in the sacrificial layer includes:

forming a mask over the sacrificial layer, the mask having an open etch region over the plug; and etching through the sacrificial layer to form the opening over the plug, using the mask and to expose a top surface of the plug.

16. The method of claim 10, further comprising:

forming a second via through the dielectric layer, a second plug in the second via, and an access device on the substrate, the access device comprising a transistor having first and second doped regions coupled to tungsten material in the first via and tungsten material in the second via respectively.

17. The method of claim 10, wherein the plug has a first lateral dimension, and the bottom electrode has a lateral dimension parallel with the first lateral dimension of the plug that is less than the first lateral dimension.

18. The method of claim 10, wherein the spacer comprises the same material as the sacrificial layer.

19. The method of claim 10, comprising:

forming a bit line overlying and contacting the top electrode.

* * * * *

UNITED STATES PATENT AND TRADEMARK OFFICE
CERTIFICATE OF CORRECTION

PATENT NO. : 10,811,602 B2
APPLICATION NO. : 15/836446
DATED : October 20, 2020
INVENTOR(S) : Erh-Kun Lai et al.

It is certified that error appears in the above-identified patent and that said Letters Patent is hereby corrected as shown below:

In Claim 1, at Column 16, Line 3, before the word "plug", insert --first--.

In Claim 1, at Column 16, Line 7, before the word "plug", insert --first--.

In Claim 2, at Column 16, Line 22, before the word "plug", insert --second--.

In Claim 2, at Column 16, Line 27, delete "a" and insert --the--.

In Claim 4, at Column 16, Line 33, before the word "plug", insert --first--.

In Claim 4, at Column 16, Line 37, before the word "plug", insert --first--.

In Claim 5, at Column 16, Line 41, before the word "plug", insert --first--.

In Claim 8, at Column 16, Line 53, before the word "plug", insert --first--.

In Claim 8, at Column 16, Line 57, before the word "plug", insert --first--.

In Claim 8, at Column 17, Line 1, before the word "barrier", insert --first--.

In Claim 8, at Column 17, Line 3, before the word "barrier", insert --first--.

In Claim 9, at Column 17, Line 12, before the word "barrier", insert --first--.

In Claim 10, at Column 17, Line 21, after "the plug;" insert a new line --forming a spacer in the first via, the spacer defining a reduced dimension opening in the first via;--.

In Claim 10, at Column 17, Line 23, after "the plug" insert --, by filling the reduced dimension opening in the first via through the sacrificial layer with tungsten material on the top surface of the plug--.

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,811,602 B2

In Claim 10, at Column 17, Line 26, after "material:" insert a new line --removing the spacer in the first via at a same process step as said removing the sacrificial layer;--.

In Claim 10, at Column 17, Line 28, after "electrode" insert --by oxidizing the upper surface of the bottom electrode--.

In Claim 10, at Column 17, Line 30, after "states;" insert --and--.

In Claim 10, at Column 17, Line 33, after "material" delete ";forming a spacer in the first via, the spacer defining a reduced dimension opening in the first via; filling the reduced dimension opening in the first via through the sacrificial layer with tungsten material, to form the bottom electrode on the top surface of the plug; removing the spacer in the first via at a same process step as said removing the sacrificial layer; and oxidizing an upper surface of the bottom electrode to form the memory element".

In Claim 11, at Column 18, Line 1, delete the word "an" and insert --the--.

In Claim 12, at Column 18, Line 6, delete the word "a" and insert --the--.

In Claim 15, at Column 18, Line 19, delete the word "an" and insert --the--.

In Claim 15, at Column 18, Line 24, delete the word "a" and insert --the--.